US012642110B2

(12) United States Patent
Haba

(10) Patent No.: US 12,642,110 B2
(45) Date of Patent: May 26, 2026

(54) MULTI-CHANNEL DEVICE STACKING

(71) Applicant: ADEIA SEMICONDUCTOR BONDING TECHNOLOGIES INC., San Jose, CA (US)

(72) Inventor: Belgacem Haba, Saratoga, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 622 days.

(21) Appl. No.: 18/052,399

(22) Filed: Nov. 3, 2022

(65) Prior Publication Data

US 2023/0207437 A1    Jun. 29, 2023

Related U.S. Application Data

(60) Provisional application No. 63/263,612, filed on Nov. 5, 2021.

(51) Int. Cl.
*H01L 23/00* (2006.01)
*H10W 70/63* (2026.01)
(Continued)

(52) U.S. Cl.
CPC ......... *H10W 70/635* (2026.01); *H10W 90/00* (2026.01); *H10W 72/07354* (2026.01);
(Continued)

(58) Field of Classification Search
CPC .......................... H01L 23/49827; H01L 24/32
See application file for complete search history.

(56) References Cited

U.S. PATENT DOCUMENTS 5,753,536 A    5/1998  Sugiyama et al.
5,771,555 A    6/1998  Eda et al.
(Continued)

FOREIGN PATENT DOCUMENTS

JP    2013-033786 A    2/2013
JP    2018-160519      10/2018
(Continued)

OTHER PUBLICATIONS

International Search Report and Written Opinion for PCT/US2022/048808, dated Mar. 10, 2023, 14 pages.
(Continued)

*Primary Examiner* — Thao P Le
(74) *Attorney, Agent, or Firm* — Knobbe, Martens, Olson & Bear, LLP

(57) ABSTRACT

A stacked electronic device is disclosed. The stacked electronic device can comprise a first stacked assembly including a first plurality of integrated device dies. The first plurality of integrated device dies can comprise a first integrated device die. A second stacked assembly is disposed over the first stacked assembly. The second stacked assembly includes a second plurality of device dies, and the second plurality of device dies can comprise a second integrated device die. A first channel can extend at least partially through the first stacked assembly. The first integrated device die can comprise a first circuit, and the first channel is connected to the first circuit. A second channel can extend through and bypass the first stacked assembly, the second channel extending at least partially through the second stacked assembly. The second integrated device die can comprise a second circuit, and the second channel is connected to the second circuit.

20 Claims, 18 Drawing Sheets

(51) Int. Cl.

| | |
|---|---|
| *H10W 90/00* | (2026.01) |
| *H10W 72/00* | (2026.01) |
| *H10W 72/30* | (2026.01) |
| *H10W 90/20* | (2026.01) |
| *H10W 90/22* | (2026.01) |

(52) U.S. Cl.

CPC .......... *H10W 72/347* (2026.01); *H10W 90/22* (2026.01); *H10W 90/297* (2026.01); *H10W 90/732* (2026.01); *H10W 90/734* (2026.01); *H10W 90/792* (2026.01)

(56) References Cited

U.S. PATENT DOCUMENTS

| | | | |
|---|---|---|---|
| 6,080,640 | A | 6/2000 | Gardner et al. |
| 6,423,640 | B1 | 7/2002 | Lee et al. |
| 6,465,892 | B1 | 10/2002 | Suga |
| 6,887,769 | B2 | 5/2005 | Kellar et al. |
| 6,908,027 | B2 | 6/2005 | Tolchinsky et al. |
| 7,045,453 | B2 | 5/2006 | Canaperi et al. |
| 7,105,980 | B2 | 9/2006 | Abbott et al. |
| 7,193,423 | B1 | 3/2007 | Dalton et al. |
| 7,750,488 | B2 | 7/2010 | Patti et al. |
| 7,803,693 | B2 | 9/2010 | Trezza |
| 8,183,127 | B2 | 5/2012 | Patti et al. |
| 8,349,635 | B1 | 1/2013 | Gan et al. |
| 8,377,798 | B2 | 2/2013 | Peng et al. |
| 8,441,131 | B2 | 5/2013 | Ryan |
| 8,461,673 | B2 | 6/2013 | Haba et al. |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,524,533 | B2 | 9/2013 | Tong et al. |
| 8,620,164 | B2 | 12/2013 | Heck et al. |
| 8,647,987 | B2 | 2/2014 | Yang et al. |
| 8,697,493 | B2 | 4/2014 | Sadaka |
| 8,716,105 | B2 | 5/2014 | Sadaka et al. |
| 8,802,538 | B1 | 8/2014 | Liu |
| 8,809,123 | B2 | 8/2014 | Liu et al. |
| 8,841,002 | B2 | 9/2014 | Tong |
| 9,093,350 | B2 | 7/2015 | Endo et al. |
| 9,142,517 | B2 | 9/2015 | Liu et al. |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,257,399 | B2 | 2/2016 | Kuang et al. |
| 9,299,736 | B2 | 3/2016 | Chen et al. |
| 9,312,229 | B2 | 4/2016 | Chen et al. |
| 9,331,149 | B2 | 5/2016 | Tong et al. |
| 9,337,235 | B2 | 5/2016 | Chen et al. |
| 9,368,450 | B1 * | 6/2016 | Gu .................... H01L 23/5385 |
| 9,385,024 | B2 | 7/2016 | Tong et al. |
| 9,394,161 | B2 | 7/2016 | Cheng et al. |
| 9,431,368 | B2 | 8/2016 | Enquist et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,496,239 | B1 | 11/2016 | Edelstein et al. |
| 9,536,848 | B2 | 1/2017 | England et al. |
| 9,559,081 | B1 | 1/2017 | Lai et al. |
| 9,589,905 | B2 | 3/2017 | Choi et al. |
| 9,620,481 | B2 | 4/2017 | Edelstein et al. |
| 9,656,852 | B2 | 5/2017 | Cheng et al. |
| 9,723,716 | B2 | 8/2017 | Meinhold |
| 9,728,521 | B2 | 8/2017 | Tsai et al. |
| 9,741,620 | B2 | 8/2017 | Uzoh et al. |
| 9,799,587 | B2 | 10/2017 | Fujii et al. |
| 9,852,988 | B2 | 12/2017 | Enquist et al. |
| 9,893,004 | B2 | 2/2018 | Yazdani |
| 9,929,050 | B2 | 3/2018 | Lin |
| 9,935,080 | B2 * | 4/2018 | Hung .................... H01L 25/50 |
| 9,941,241 | B2 | 4/2018 | Edelstein et al. |
| 9,941,243 | B2 | 4/2018 | Kim et al. |
| 9,953,941 | B2 | 4/2018 | Enquist |
| 9,960,142 | B2 | 5/2018 | Chen et al. |
| 10,002,844 | B1 | 6/2018 | Wang et al. |
| 10,026,605 | B2 | 7/2018 | Doub et al. |
| 10,036,734 | B2 | 7/2018 | Fennell et al. |
| 10,075,657 | B2 | 9/2018 | Fahim et al. |
| 10,204,893 | B2 | 2/2019 | Uzoh et al. |
| 10,269,756 | B2 | 4/2019 | Uzoh |
| 10,276,619 | B2 | 4/2019 | Kao et al. |
| 10,276,909 | B2 | 4/2019 | Huang et al. |
| 10,418,277 | B2 | 9/2019 | Cheng et al. |
| 10,446,456 | B2 | 10/2019 | Shen et al. |
| 10,446,487 | B2 | 10/2019 | Huang et al. |
| 10,446,532 | B2 | 10/2019 | Uzoh et al. |
| 10,508,030 | B2 | 12/2019 | Katkar et al. |
| 10,522,499 | B2 | 12/2019 | Enquist et al. |
| 10,707,087 | B2 | 7/2020 | Uzoh et al. |
| 10,784,191 | B2 | 9/2020 | Huang et al. |
| 10,790,262 | B2 | 9/2020 | Uzoh et al. |
| 10,840,135 | B2 | 11/2020 | Uzoh |
| 10,840,205 | B2 | 11/2020 | Fountain, Jr. et al. |
| 10,854,578 | B2 | 12/2020 | Morein |
| 10,879,212 | B2 | 12/2020 | Uzoh et al. |
| 10,886,177 | B2 | 1/2021 | DeLaCruz et al. |
| 10,892,246 | B2 | 1/2021 | Uzoh |
| 10,923,408 | B2 | 2/2021 | Huang et al. |
| 10,923,413 | B2 | 2/2021 | DeLaCruz |
| 10,950,547 | B2 | 3/2021 | Mohammed et al. |
| 10,964,664 | B2 | 3/2021 | Mandalapu et al. |
| 10,985,133 | B2 | 4/2021 | Uzoh |
| 10,991,804 | B2 | 4/2021 | DeLaCruz et al. |
| 10,998,292 | B2 | 5/2021 | Lee et al. |
| 11,004,757 | B2 | 5/2021 | Katkar et al. |
| 11,011,494 | B2 | 5/2021 | Gao et al. |
| 11,011,503 | B2 | 5/2021 | Wang et al. |
| 11,031,285 | B2 | 6/2021 | Katkar et al. |
| 11,037,919 | B2 | 6/2021 | Uzoh et al. |
| 11,056,348 | B2 | 7/2021 | Theil |
| 11,069,734 | B2 | 7/2021 | Katkar |
| 11,088,099 | B2 | 8/2021 | Katkar et al. |
| 11,127,738 | B2 | 9/2021 | DeLaCruz et al. |
| 11,158,606 | B2 | 10/2021 | Gao et al. |
| 11,171,117 | B2 | 11/2021 | Gao et al. |
| 11,176,450 | B2 | 11/2021 | Teig et al. |
| 11,256,004 | B2 | 2/2022 | Haba et al. |
| 11,264,357 | B1 | 3/2022 | DeLaCruz et al. |
| 11,276,676 | B2 | 3/2022 | Enquist et al. |
| 11,296,044 | B2 | 4/2022 | Gao et al. |
| 11,329,034 | B2 | 5/2022 | Tao et al. |
| 11,342,238 | B2 * | 5/2022 | Hossain .............. H01L 23/3114 |
| 11,348,898 | B2 | 5/2022 | DeLaCruz et al. |
| 11,355,443 | B2 | 6/2022 | Huang et al. |
| 2004/0084414 | A1 | 5/2004 | Sakai et al. |
| 2006/0057945 | A1 | 3/2006 | Hsu et al. |
| 2007/0111386 | A1 | 5/2007 | Kim et al. |
| 2007/0181991 | A1 | 8/2007 | Ishino et al. |
| 2008/0237310 | A1 | 10/2008 | Periaman et al. |
| 2008/0315333 | A1 | 12/2008 | Combi et al. |
| 2010/0008058 | A1 | 1/2010 | Saen et al. |
| 2011/0031600 | A1 | 2/2011 | Kim |
| 2011/0110065 | A1 | 5/2011 | Forster, Sr. et al. |
| 2011/0272798 | A1 | 11/2011 | Lee et al. |
| 2014/0175655 | A1 | 6/2014 | Chen et al. |
| 2015/0021789 | A1 | 1/2015 | Lin |
| 2015/0031189 | A1 | 1/2015 | Chen et al. |
| 2015/0064498 | A1 | 3/2015 | Tong |
| 2015/0116968 | A1 | 4/2015 | Yamada et al. |
| 2015/0206854 | A1 * | 7/2015 | Lane .................... H01L 24/19 |
| | | | 257/737 |
| 2015/0255416 | A1 * | 9/2015 | Kim .................... H01L 24/19 |
| | | | 438/126 |
| 2016/0233264 | A1 | 8/2016 | Kagawa et al. |
| 2016/0343682 | A1 | 11/2016 | Kawasaki |
| 2016/0343762 | A1 | 11/2016 | Kagawa et al. |
| 2017/0213808 | A1 * | 7/2017 | Pan .................... H01L 24/19 |
| 2018/0005977 | A1 | 1/2018 | Lin |
| 2018/0175012 | A1 | 6/2018 | Wu et al. |
| 2018/0182639 | A1 | 6/2018 | Uzoh et al. |
| 2018/0182666 | A1 | 6/2018 | Uzoh et al. |
| 2018/0190580 | A1 | 7/2018 | Haba et al. |

(56) References Cited

U.S. PATENT DOCUMENTS

| | | |
|---|---|---|
| 2018/0190583 A1 | 7/2018 | DeLaCruz et al. |
| 2018/0219038 A1 | 8/2018 | Gambino et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0198409 A1 | 6/2019 | Katkar et al. |
| 2019/0214424 A1 | 7/2019 | Borthakur et al. |
| 2019/0265411 A1 | 8/2019 | Huang et al. |
| 2019/0333550 A1 | 10/2019 | Fisch |
| 2019/0355637 A1 | 11/2019 | Chen et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395304 A1 | 12/2020 | Chen et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118849 A1 | 4/2021 | Limaye et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0005521 A1* | 1/2022 | Sethuraman ........ G06F 13/1684 |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1* | 8/2023 | Haba .................... H01L 23/467 |
| | | 257/713 |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |
| 2025/0096191 A1 | 3/2025 | Gao et al. |
| 2025/0112123 A1 | 4/2025 | Katkar et al. |
| 2025/0185163 A1 | 6/2025 | Zhao et al. |
| 2025/0210585 A1 | 6/2025 | Fountain, Jr. et al. |
| 2025/0212554 A1 | 6/2025 | Katkar et al. |
| 2025/0218903 A1 | 7/2025 | Uzoh et al. |
| 2025/0273517 A1 | 8/2025 | Lee et al. |

FOREIGN PATENT DOCUMENTS

| | | |
|---|---|---|
| KR | 10-0871381 B1 | 12/2008 |
| WO | WO 2005/043584 A2 | 5/2005 |

OTHER PUBLICATIONS

Clarke, Peter, "Backside of the wafer promised 3D chip improvements," May 20, 2019, https://www.eenewsanalog.com/news/backside-wafer-promises-3d-chip-improvements, downloaded Jul. 5, 2021. 3 pages.

Ker, Ming-Dou et al., "Fully process-compatible layout design on bond pad to improve wire bond reliability in CMOS Ics," IEEE

(56) References Cited

OTHER PUBLICATIONS

Transactions on Components and Packaging Technologies, Jun. 2002, vol. 25, No. 2, pp. 309-316.

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2-SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Peters, Laura, "Challenges in backside power delivery," https://semiengineering.com/challenges-in-backside-power-delivery, Nov. 17, 2022 (printed Nov. 23, 2022), 14 pages.

Plobi, A. et al., "Wafer direct bonding: tailoring adhesion between brittle materials," Materials Science and Engineering Review Journal, 1999, R25, 88 pages.

European partial Search Report dated Aug. 21, 2025 for Application No. 22890767.1, 16 pages.

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820.".

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260."

Kim, Joonyoung et al., "HBM: Memory Solution for Bandwidth-Hungry Processors," Aug. 2014, https://xdevs.com/doc/Memory/HBM/Hynix/HC26.11.310-HBM-Bandwidth-Kim-Hynix-Hot%20Chips%20HBM%202014%20v7.pdf, downloaded Aug. 29, 2023, 24 pages.

Lee, Dong Uk et al., "A 1.2 V 8 GB 8-Channel 128 GB/s High-Bandwidth Memory (HBM) Stacked DRAM With Effective I/O Test Circuits," IEEE Journal of Solid-State Circuits, Oct. 14, 2014, vol. 50, No. 1, pp. 191-203.

European Extended Search Report dated Nov. 11, 2025, for Application No. 22890767.1, 14 pages.

International Preliminary Report on Patentability for PCT/US2022/048808, issued May 2, 2024.

* cited by examiner

MULTI-CHANNEL DEVICE STACKING

CROSS-REFERENCE TO RELATED APPLICATIONS

This application claims priority to U.S. Provisional Application No. 63/263,612, filed Nov. 5, 2021, titled "MULTI-CHANNEL DEVICE STACKING," the disclosure of which is incorporated herein by reference in its entirety for all purposes.

BACKGROUND

Field of the Invention

The field relates to multi-channel device stacking.

Description of the Related Art

Multiple semiconductor elements (such as integrated device dies) may be stacked on top of one another in various applications, such as processors, high bandwidth memory (HBM) devices, or other devices that utilize vertical integration. The stacked elements can electrically communicate with one another. Signals and power can be transferred through the dies by way of through substrate vias (TSVs).

BRIEF DESCRIPTION OF THE DRAWINGS

Like reference numbers are used to refer to like features throughout the description and drawings.

DETAILED DESCRIPTION

Providing electrical communication among a plurality of stacked device dies can be challenging. In particular, it is challenging to convey signals through a thickness of device dies while maintaining very fine pitches. Direct hybrid bonding, as compared with solder bonding, enables very fine pitch electrical connections between vertically adjacent dies, while also significantly reducing the thickness of the die stack, as compared to using thick solder balls between the dies. In conventional memory die stacks, the system comprises a single channel configured to provide read/write signals through the entire die stack. More specifically, in high bandwidth memory (HBM) technologies, one channel exists in a die stack, and every signal is transferred to every die in the die stack. In hybrid memory cube (HMC) technologies, a die stack comprises a plurality of channels, and every signal is transferred to every die in the die stack. Various embodiments disclosed herein connect subsets of dies in the die stack to form a bandwidth channel. For example, a first channel may convey signal to a plurality of dies in a first stacked assembly and a second channel may convey signal to a plurality of dies in a second stacked assembly disposed over the first stacked assembly, such that the second channel bypasses the active circuitry of the plurality of dies in the first stacked assembly. Such a technique could be used for any suitable types of integrated device dies, including memory dies (e.g., dynamic random access memory (DRAM), flash memory with logical NAND-type structure (NAND)) and would beneficially allow for the implementation of multiple channels, wherein each channel may provide a unique signal. For example, interconnects can be disposed through dicing lanes in the plurality of dies such that a high-speed signal can be disposed on a front leading edge of a die stack while other signal inputs/outputs can be disposed on other edges of the die stack. In various embodiments, some dies can have signal pass through vias. In various embodiments, thermo-compression or direct hybrid bonding electrically connects vertically adjacent dies. In various embodiments, power and ground can be shared by all channels in the stacked device and in various embodiments, interconnects can be disposed through dummy silicon blocks under the same conditions as would be used with dicing lanes. In various embodiments, a redistribution layer (RDL) may be disposed over a die surface for configurations where interleaved dies are stacked with active front sides facing each other.

Figure 1:
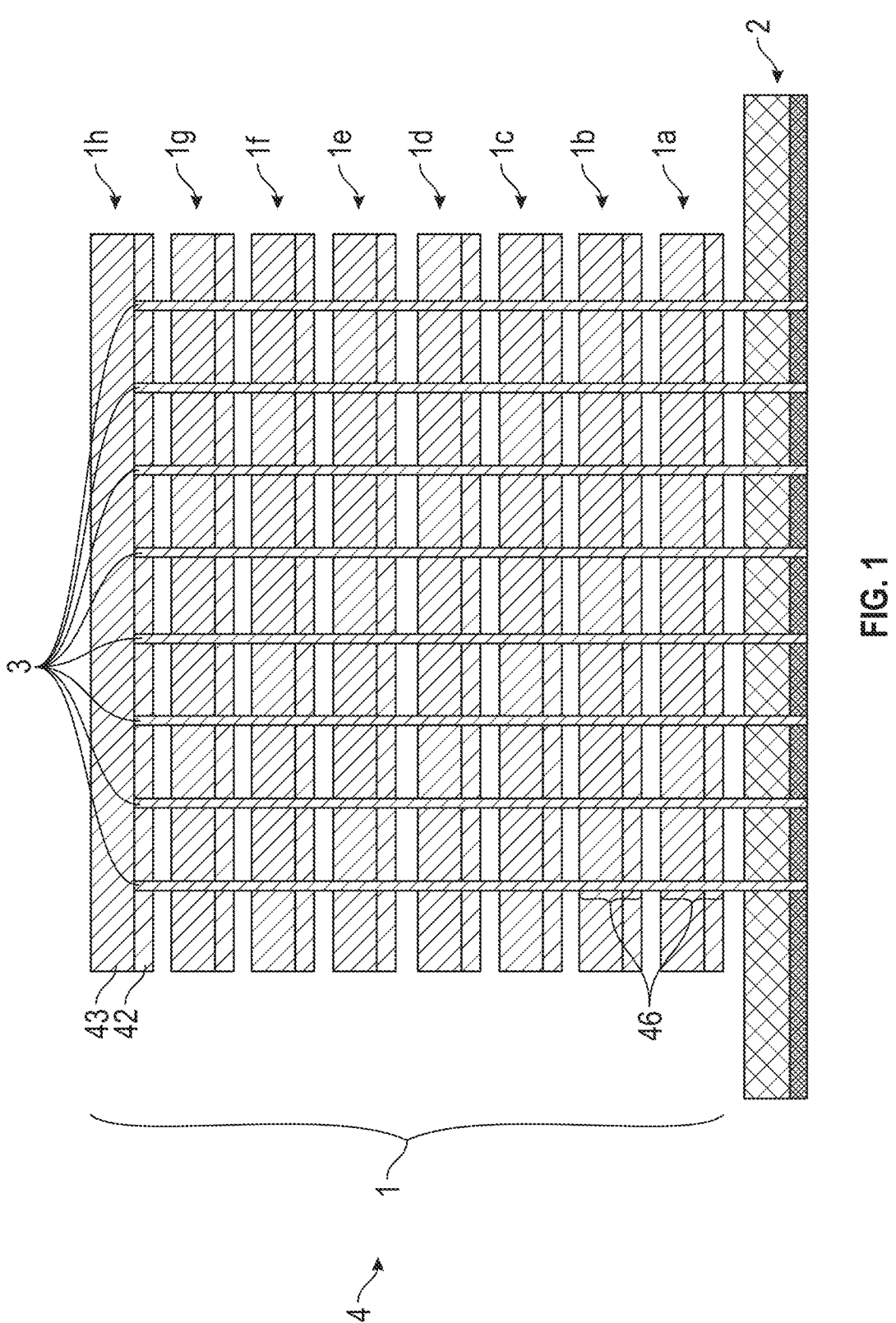
FIG. 1 is a schematic side sectional view of a plurality of integrated device dies stacked on top of one another, a carrier, and a plurality of through substrate vias (TSVs) comprising a single channel, according to one embodiment.

FIG. 1 is a schematic side sectional view of a conventional stacked electronic device 4. The stacked electronic device can be used in any suitable type of electronic system, such as high bandwidth memory (HBM), hybrid memory cube (HMC) technologies, or any other suitable stacked system. As shown, a plurality of integrated device dies 1a-1h (e.g., memory dies, processor dies, etc.) can be stacked on top of one another. Bonding layers 42 can be provided over a semiconductor layer 43 for each of the dies 1a-1h. The semiconductor layer 43 can comprise a semiconductor device region in which active devices (such as transistors) can be formed. The bonding layer 42 can comprise one or multiple metallization layers disposed over the semiconductor layer 43. The stacked dies can be mounted on a carrier 2. In the illustrated arrangement, the carrier 2 can comprise a logic or processor die, and the stacked dies 1a-1h can comprise memory dies. A plurality of signal lines 3 can be provided through the stacked dies 1a-1h. For example, each die can comprise a plurality of interconnects (e.g., a plurality of through substrate vias (TSVs) 46) that convey signal through the die to connect to vertically adjacent dies (for example, the TSVs 46 are the physical metal interconnects or vias that extend separately through each die). The dies can be mounted and stacked to one another by way of, for example, solder balls or thermocompression bonding (TCB). In FIG. 1, the signal lines 3 can comprise a single channel that connects to every die 1a-1h in the stack. In some arrangements, the signal lines 3 can comprise multiple channels, with each channel connected to every die in the stack.

Figure 2:
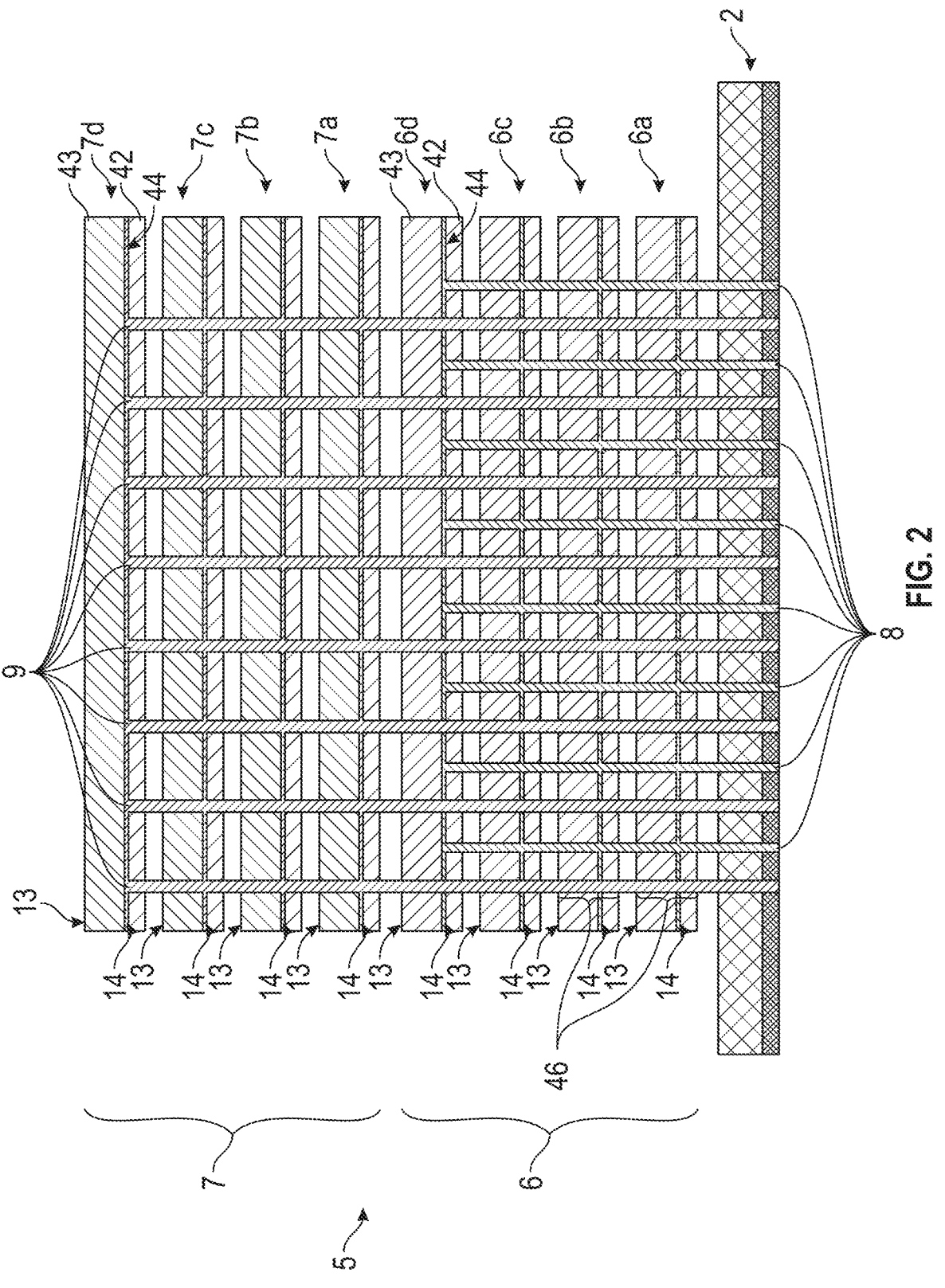
FIG. 2 is a schematic side sectional view of a first stacked assembly including a first plurality of integrated device dies, a second stacked assembly disposed over the first stacked assembly and including a second plurality of integrated device dies, a first plurality of TSVs comprising a first channel, a second plurality of TSVs comprising a second channel, and a carrier, according to one embodiment.

FIG. 2 is a schematic side sectional view of a stacked electronic device 5, according to various embodiments. The electronic device 5 can include a first stacked assembly 6 including a first plurality of integrated device dies 6a-6d. The electronic device can include a second stacked assembly 7 including a second plurality of device dies 7a-7d. The second stacked assembly 7 can be disposed over the first stacked assembly 6. A first channel 8 can extend at least partially through the first stacked assembly 6. A first integrated device die 6a can include a first circuit (not shown), and the first channel 8 can be connected to the first circuit. A second channel 9 can extend through and bypass the first stacked assembly 6. The second channel 9 can extend at least partially through the second stacked assembly 7. The second integrated device die 7a can include a second circuit (not shown), and the second channel 9 can be connected to the second circuit. In various embodiments, each of the first plurality of integrated device dies 6a-6d comprises an active circuitry region 44 (between the bonding layer 42 and the semiconductor layer 43), and at least read and/or write signals of the second channel 9 bypass, or do not electrically connect to, the active circuitry regions 44 of the first plurality of integrated device dies 6a-6d.

Further, in FIG. 2, each die can have an active front side 14 and a back side 13 opposite the active front side 14. In FIG. 2, the stacked device 5 is arranged such that the active front sides 14 of the first 6a-6d and second 7a-7d pluralities of dies face the same direction (e.g., downward towards the carrier) in a front-to-back arrangement. The dies can be direct hybrid bonded in a front-to-back arrangement. In other embodiments, however, the dies can be directly bonded in a front-to-front or back-to-back arrangement. In various embodiments, a channel (such as the first and/or second channels 8, 9) can comprise a connection path between a memory controller (e.g., a logic die such as the carrier 2) and a memory module (e.g., a dynamic random access memory (DRAM) module such as any of the dies 1a-1h). A channel can comprise an electrical pathway along which a read/write signal is carried. In a single-channel application, one read or write signal can be carried at a time, whereas in a multiple-channel application, multiple read/write signals can be carried independently in parallel.

The first 8 and second 9 channels can extend through TSVs 46 that pass through the individual dies 6a-6c, 7a-7c of the die stacks 6, 7. In various embodiments, TSVs 46 may not be provided in the uppermost dies 6d, 7d of the stacks 6, 7, for example, in face-down arrangements in which the signal need not be transferred through the uppermost dies 6d, 7d. The integrated device dies can be mounted and electrically connected to one another in any suitable manner. It should be appreciated that, although the die stacks 6, 7 are illustrated schematically with vertical gaps disposed between vertically adjacent dies, the skilled artisan would understand that the dies can be physically and electrically connected to one another (see e.g., FIGS. 5-6). For example, in some embodiments, the first stacked assembly (die stack) 6 can be directly bonded to the second stacked assembly (die stack) 7 without an adhesive. Further, the dies 6a-6d, 7a-7d within each stack 6, 7 can also be directly bonded to one another without an adhesive. As explained below, a hybrid direct bonding process can be used to connect vertically adjacent die stacks, and to connect vertically adjacent integrated device dies. For example, opposing TSVs 46 can be direct bonded to one another without an adhesive in various embodiments (see e.g., FIG. 7). In some embodiments, wider contact pads can be provided over the TSVs 46 and direct bonded to one another. In other embodiments, the TSVs 46 can directly connect to one another. In other embodiments, TSVs 46 of the first 8 and/or second 9 channels can be laterally offset in adjacent dies. Although the illustrated embodiments show directly bonded stacked assemblies, in other embodiments, the first stacked assembly 6 can be bonded to the second stacked assembly 7 using solder. The dies within the assemblies can be bonded using solder.

Accordingly, as shown in FIG. 2, each of the first 8 and second 9 channels may electrically connect to only a subset of the dies in the stacked electronic device 5. For example, the first channel 8 can electrically connect to only dies 6a-6d, and the second channel 9 can electrically connect to only dies 7a-7d. Beneficially, the stacked electronic device 5 of FIG. 2 can enable the use of multiple different channels to connect to different dies (or stacks of dies) within the device. Such an arrangement can increase the bandwidth of the stacked device. For example, in the arrangement of FIG. 1, only one die of the stack 1 can be accessed at a time because all of the dies 1a-1h in the stack 1 (e.g., eight dies in the stack of FIG. 1) are shorted together in one channel. By contrast, in FIG. 2, there are two stacks 6, 7 of four dies each 6a-6d, 7a-7d, with two independent channels 8, 9. Accordingly, in FIG. 2, at least one die from each of the two channels can be accessed at the same time, which can double the bandwidth of the stacked device. It should be appreciated that, although two channels 8, 9 are shown connected to two respective die stacks 6, 7, any suitable number of channels and die stacks can be provided. For example, three, four, or more than four channels and stacks (or sets) of dies can be provided. In addition, although each die stack 6, 7 of FIG. 2 includes four dies, in other embodiments, each die stack can include two, three, five, or more than five dies. Each die stack can include the same number of dies, or a different number of dies.

Figure 3:
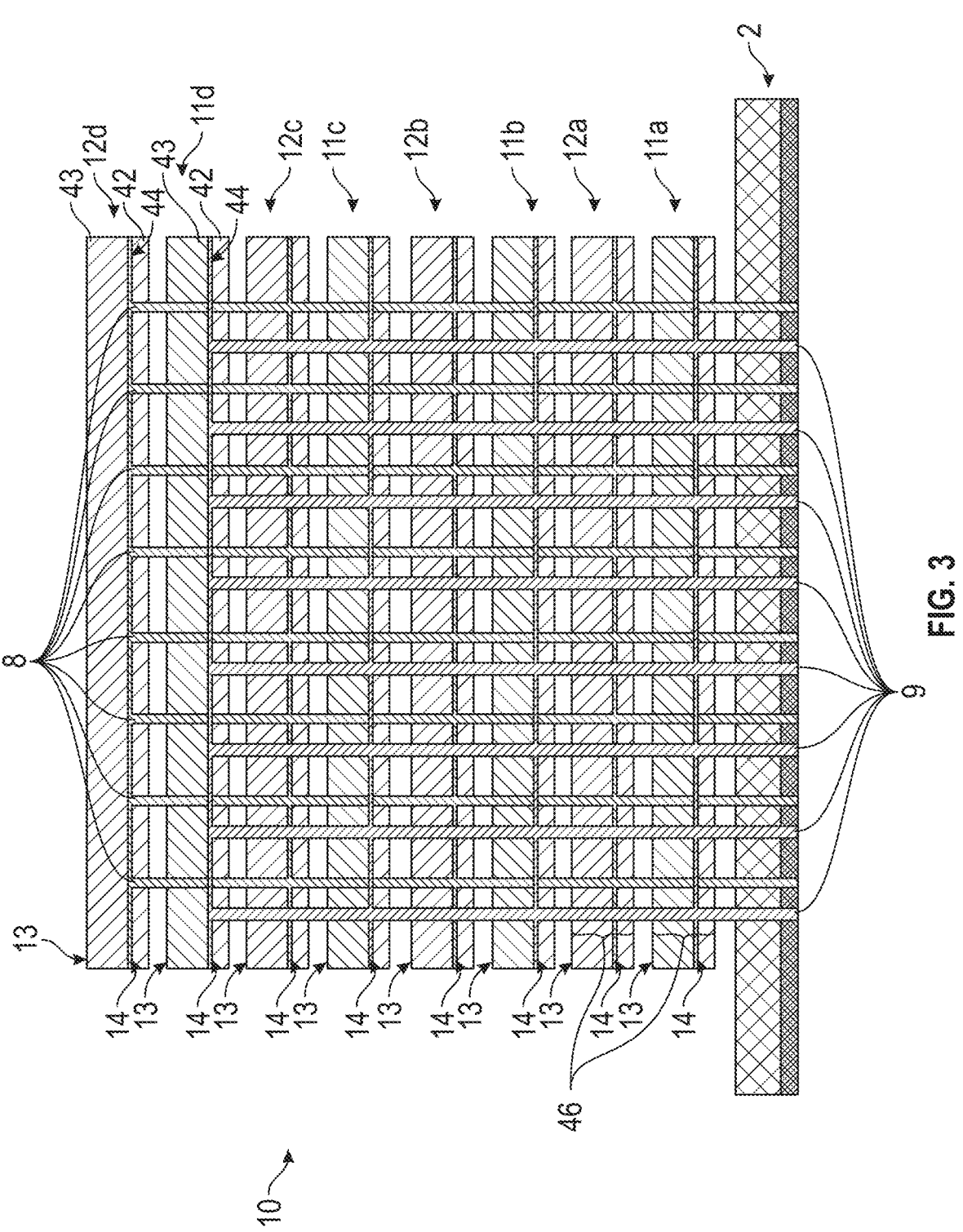
FIG. 3 is a schematic side sectional view of a first plurality of integrated device dies and a second plurality of integrated device dies stacked together such that the integrated device dies of the first plurality of integrated device dies are interleaved with the integrated device dies of the second plurality of integrated device dies, a first plurality of TSVs comprising a first channel, a second plurality of TSVs comprising a second channel, and a carrier, according to one embodiment.

FIG. 3 is a schematic side sectional view of a stacked electronic device 10, according to another embodiment. Unless otherwise noted, the components and concepts described herein in connection with FIG. 3 may be the same as or generally similar to the components and concepts described above in connection with FIG. 2. As with FIG. 2, in FIG. 3, the stacked electronic device 10 can include a first plurality of integrated device dies 11*a*-11*d* and a second plurality of integrated device dies 12*a*-12*d*. The first and second pluralities of integrated device dies are stacked together. A first channel 8 can extend at least partially through the first 11*a*-11*d* and second pluralities 12*a*-12*d* of integrated device dies. The first channel 8 is connected to circuitry in the active circuitry region 44 in the second plurality of integrated device dies 12*a*-12*d* and bypasses circuitry in the active circuitry region 44 in the first plurality of integrated device dies 11*a*-11*d* (e.g., at least read and/or write signals of the first channel 8 bypass the active circuitry regions 44 in the first plurality of integrated device dies 11*a*-11*d*). A second channel 9 can extend at least partially through the first 11*a*-11*d* and second pluralities 12*a*-12*d* of integrated device dies. The second channel 9 is connected to circuitry in the active circuitry region 44 in the first plurality of integrated device dies 11*a*-11*d*. Thus, the stacked electronic device 10 of FIG. 3 can enable the use of multiple different channels to connect different dies (or stacks of dies) within the device, thereby increasing the bandwidth of the stacked device 10.

Unlike the embodiment of FIG. 2 (e.g., in which a second plurality of dies 7*a*-7*d* is stacked on a first plurality of dies 6*a*-6*d*, or vice versa), in FIG. 3, the first 11*a*-11*d* and second 12*a*-12*d* pluralities of integrated device dies are stacked together such that the integrated device dies of the first plurality of integrated device dies 11*a*-11*d* are interleaved with the integrated device dies of the second plurality of integrated device dies 12*a*-12*d*. Further, in FIG. 3, each die can have an active front side 14 and a back side 13 opposite the active side 14. Active circuitry 44 (e.g., transistors) can be disposed closer to the front side 14 than the back side of each die 13. In FIG. 3, the stacked device 10 is arranged such that the active front sides 14 of the first 11*a*-11*d* and second 12*a*-12*d* pluralities of dies face the same direction (e.g., downward towards the carrier) in a front-to-back arrangement. The dies can be direct hybrid bonded, such that the active front sides 14 of each die are directly bonded to the back sides 13 of vertically adjacent dies. In other embodiments, however, the active sides 14 in the first 11*a*-11*d* and second 12*a*-12*d* pluralities of dies can face upwardly away from the carrier 2. It should be appreciated that, although the plurality of dies 11*a*-11*d* and 12*a*-12*d* are illustrated schematically with vertical gaps disposed between vertically adjacent dies, the skilled artisan would understand that the dies can be physically and electrically connected to one another (see e.g., FIGS. 5-6).

Figure 4:
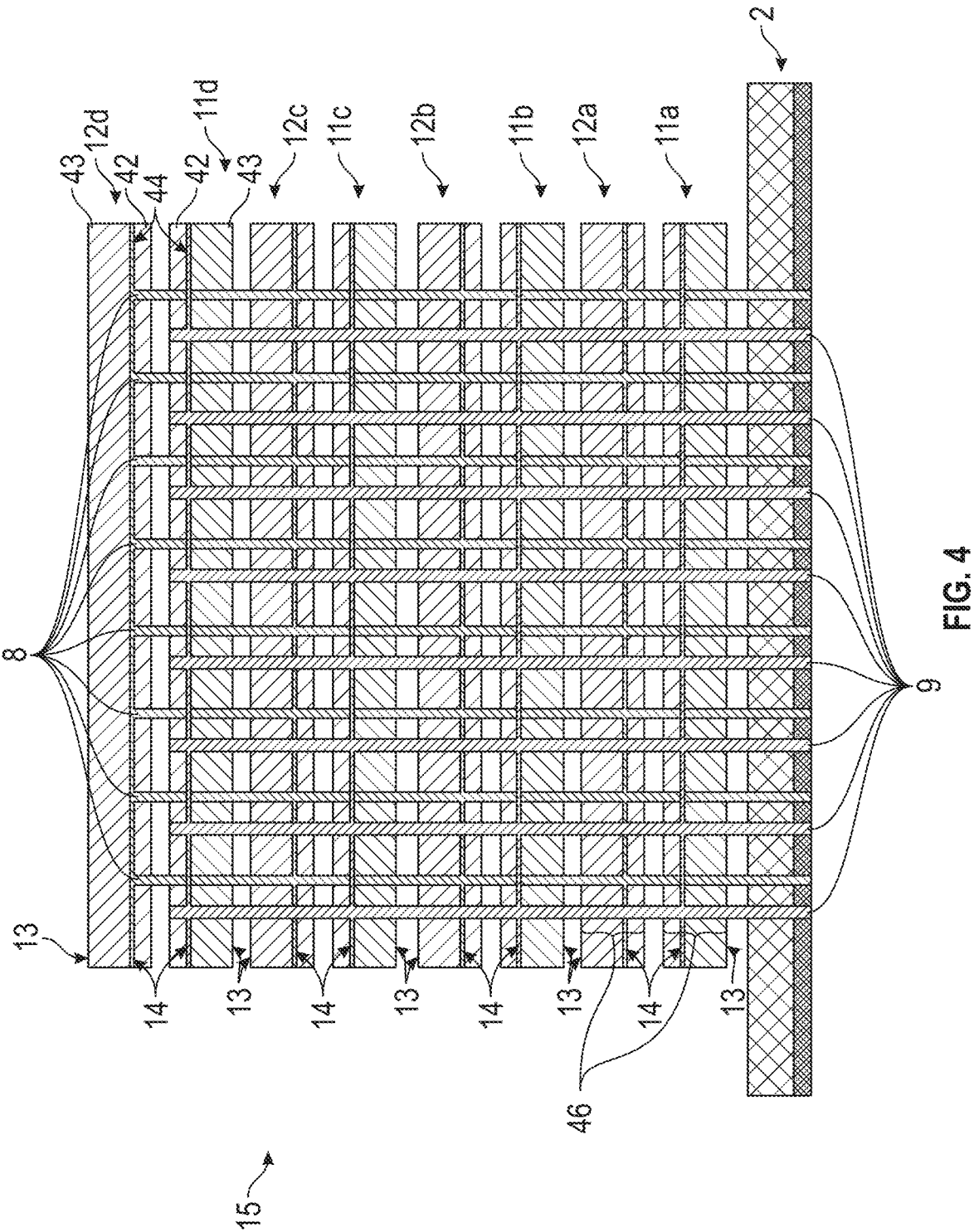
FIG. 4 is a schematic side sectional view of a first plurality of integrated device dies and a second plurality of integrated device dies stacked together such that the integrated device dies of the first plurality of integrated device dies are interleaved with the integrated device dies of the second plurality of integrated device dies and active sides of the first and second pluralities of dies are face-to-face, a first plurality of TSVs comprising a first channel, a second plurality of TSVs comprising a second channel, and a carrier, according to one embodiment.

FIG. 4 is a schematic side sectional view of a stacked electronic device 15, according to another embodiment. Unless otherwise noted, the components and concepts described herein in connection with FIG. 4 may be the same as or generally similar to the components and concepts described above in connection with FIG. 3. Like the embodiment of FIG. 3, the stacked electronic device 15 of FIG. 4 can enable the use of multiple different channels 8, 9 to connect different dies (or stacks of dies) 11*a*-11*d*, 12*a*-12*d* within the device. Such an arrangement increases the bandwidth of the stacked device 15. Additionally, the dies can be direct hybrid bonded to one another. Unlike the embodiment of FIG. 3, as shown in FIG. 4, the active front sides 14 of the first 11*a*-11*d* and second 12*a*-12*d* pluralities of dies can be disposed face-to-face so as to face one another. The active front sides 14 of each vertically adjacent die can be directly bonded to one another, and the back sides 13 of each vertically adjacent die can be directly bonded to one another.

For example, the dies of the second plurality of dies 12*a*-12*d* can face downward towards the carrier 2, and the dies of the first plurality of dies 11*a*-11*d* can face upward away from the carrier 2. As in FIG. 3, in FIG. 4 it should be appreciated that, although the plurality of dies 11*a*-11*d* and 12*a*-12*d* are illustrated schematically with vertical gaps disposed between vertically adjacent dies, the skilled artisan would understand that the dies can be physically and electrically connected to one another (see e.g., FIGS. 5-6).

Figure 5:
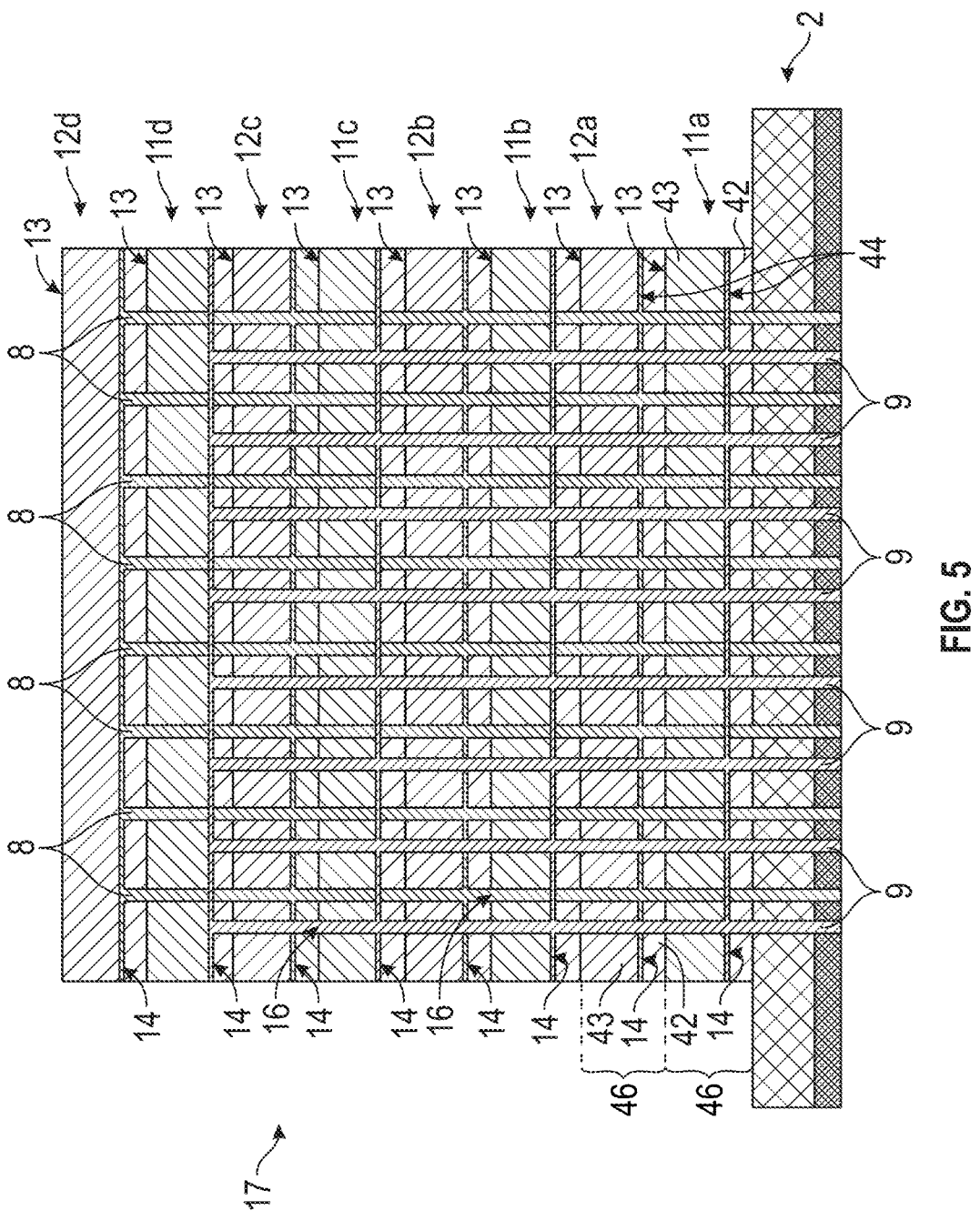
FIG. 5 is a schematic side sectional view of a first plurality of integrated device dies and a second plurality of integrated device dies directly bonded together in a stack such that the integrated device dies of the first plurality of integrated device dies are interleaved with the integrated device dies of the second plurality of integrated device dies, a first plurality of TSVs comprising a first channel, a second plurality of TSVs comprising a second channel, and a carrier, according to one embodiment.
Figure 6:
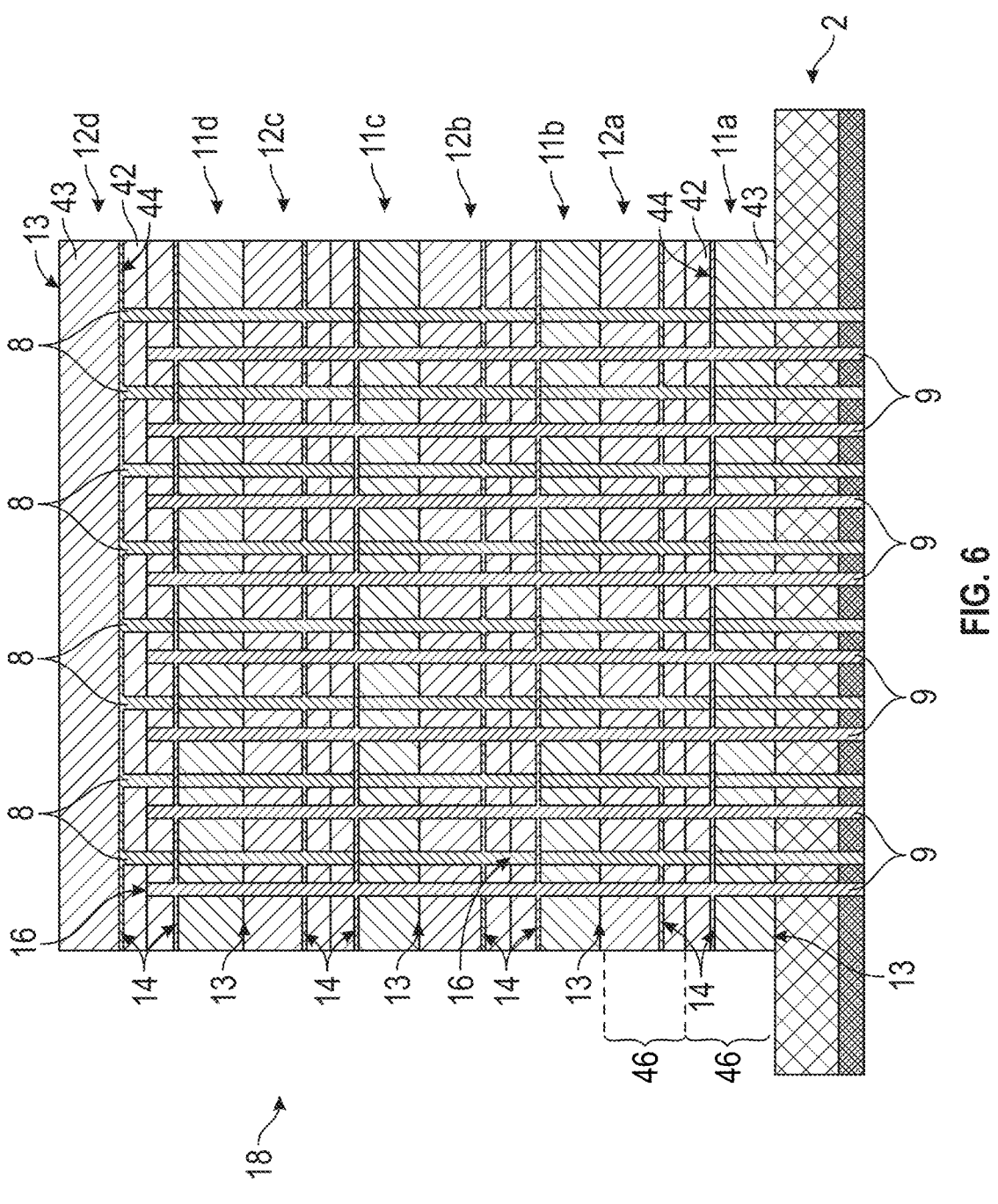
FIG. 6 is a schematic side sectional view of a first plurality of integrated device dies and a second plurality of integrated device dies directly bonded together in a stack such that the integrated device dies of the first plurality of integrated device dies are interleaved with the integrated device dies of the second plurality of integrated device dies and active sides of the first and second pluralities of dies are face-to-face, a first plurality of TSVs comprising a first channel, a second plurality of TSVs comprising a second channel, and a carrier, according to one embodiment.
Figure 7:
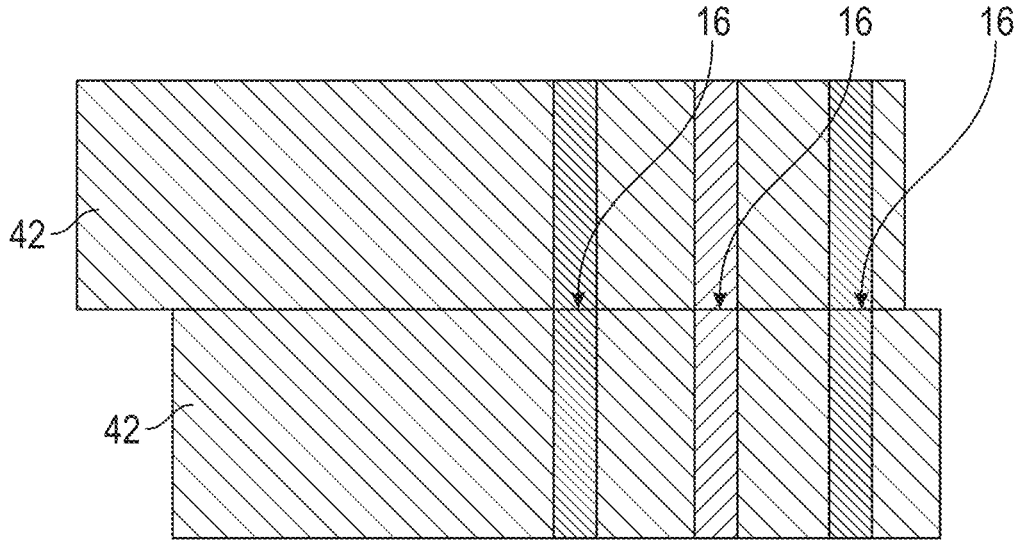
FIG. 7 is a schematic side sectional view of a plurality of conductive features directly bonded to one another.

FIG. 5 illustrates a stacked device 17 similar to that shown in FIG. 3, in which the active sides 4 face the same direction (e.g., downwardly toward the carrier 2). FIG. 6 illustrates a stacked device 18 similar to that shown in FIG. 4, in which the active sides 14 of the first 11*a*-11*d* and second 12*a*-12*d* pluralities of dies face in opposite directions (e.g., towards one another). As shown in FIGS. 5-7, conductive features 16 (e.g., opposing TSVs and/or contact pads) can be directly bonded to one another without an adhesive, which can enable the use of finely-pitched interconnections as compared to conventional structures. In some embodiments, the conductive features 16 can comprise contact features on opposing dies that directly contact one another to form an electrical connection without an adhesive. In various embodiments, the conductive features 16 can comprise exposed ends of TSVs, contact pads, or other metallization exposed at the bonding surface.

Figure 8:
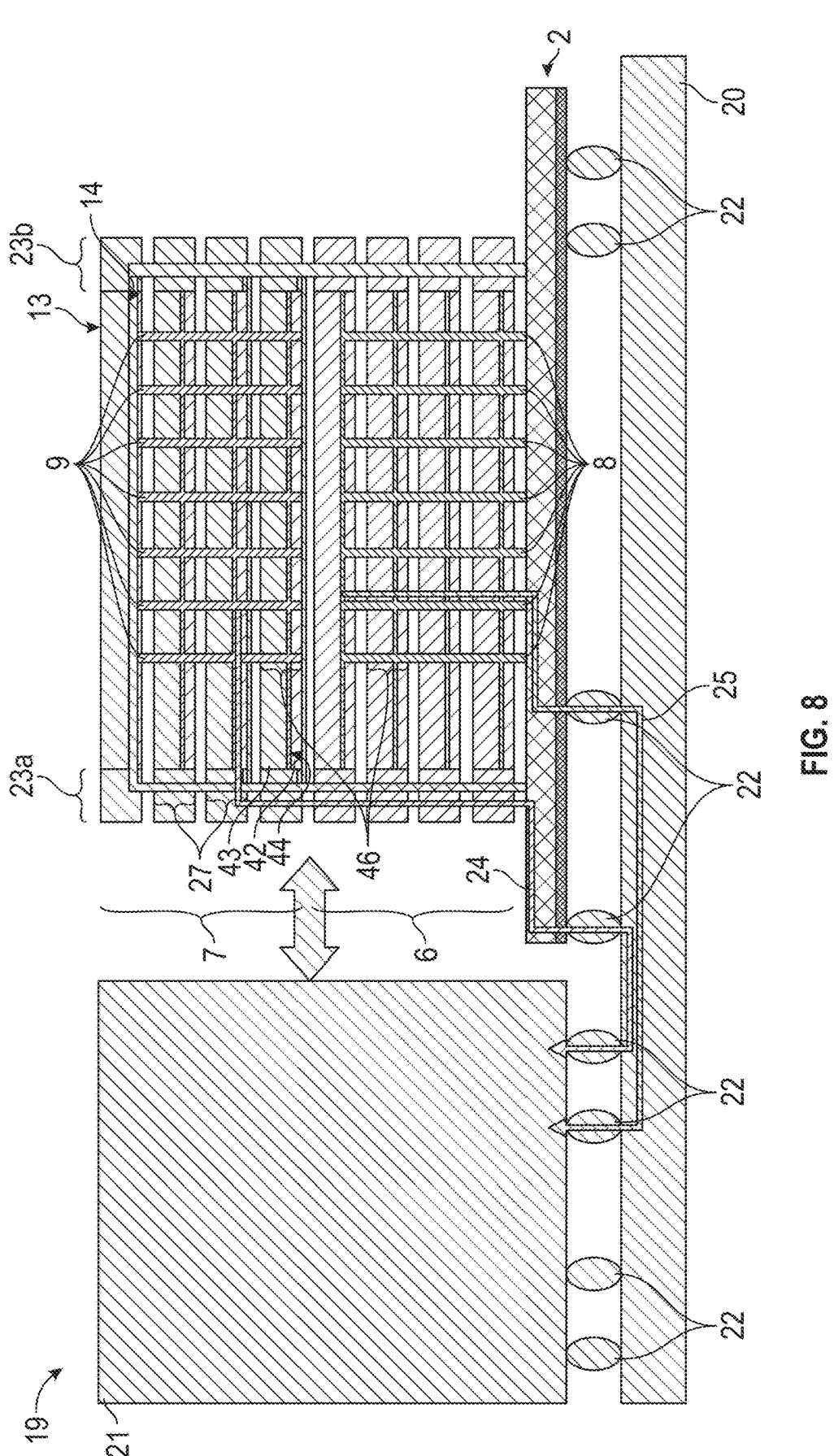
FIG. 8 is a schematic side sectional view of a first stacked assembly including a first plurality of integrated device dies, a second stacked assembly disposed over the first stacked assembly and including a second plurality of integrated device dies, a first plurality of TSVs comprising a first channel, a second plurality of TSVs comprising a second channel, a first channel pathway, a second channel pathway, a processor or logic die, dicing lanes, a TSV disposed in the dicing lanes, a carrier, and a substrate, according to one embodiment.

FIG. 8 is a schematic side sectional view of a stacked electronic device 19, according to another embodiment. Unless otherwise noted, the components and concepts described herein in connection with FIG. 8 may be the same as or generally similar to the components and concepts described above in connection with FIGS. 2-7. As shown in FIG. 8, the first 6 and second 7 stacked structures can be disposed over one another, as shown in FIG. 2. The stacked dies can be mounted to a carrier 2, such as a logic die or interposer. The carrier 2 can be mounted to a substrate 20, such as an interposer or other device die. A processor or logic die 21 can be mounted to the substrate 20 spaced apart from the carrier 2. As shown, the processor or logic die 21 and the carrier 2 can be mounted to the substrate 20 by way of solder balls 22. In other embodiments, the processor or logic die 21 and/or the carrier 2 can be directly bonded to the substrate 20.

Unlike the embodiments of FIGS. 2-7, in FIG. 8, the first 8 and second 9 channels can electrically connect to the respective die stacks by way of TSVs 27 disposed in dicing lanes 23*a*, 23*b* at or near a periphery of the dies (e.g., outside an active area of the dies). As shown, a first channel pathway 24 can extend from the logic die 21, through the substrate 20 and carrier 2 (for example, by way of trace in the substrate 20 and carrier 2), and can bypass the lower die stack by way of TSVs 27 through the dicing lanes 23*a*, 23*b* of the dies. The first channel pathway 24 can connect to the upper stack of dies 7 without electrically connecting to circuits in the lower stack of dies 6. A second channel pathway 25 can extend from the logic die 21, through the substrate 20 and carrier 2 (for example, by way of trace in the substrate 20 and carrier 2), and can electrically connect to the dies of the lower die stack 6.

Figure 9:
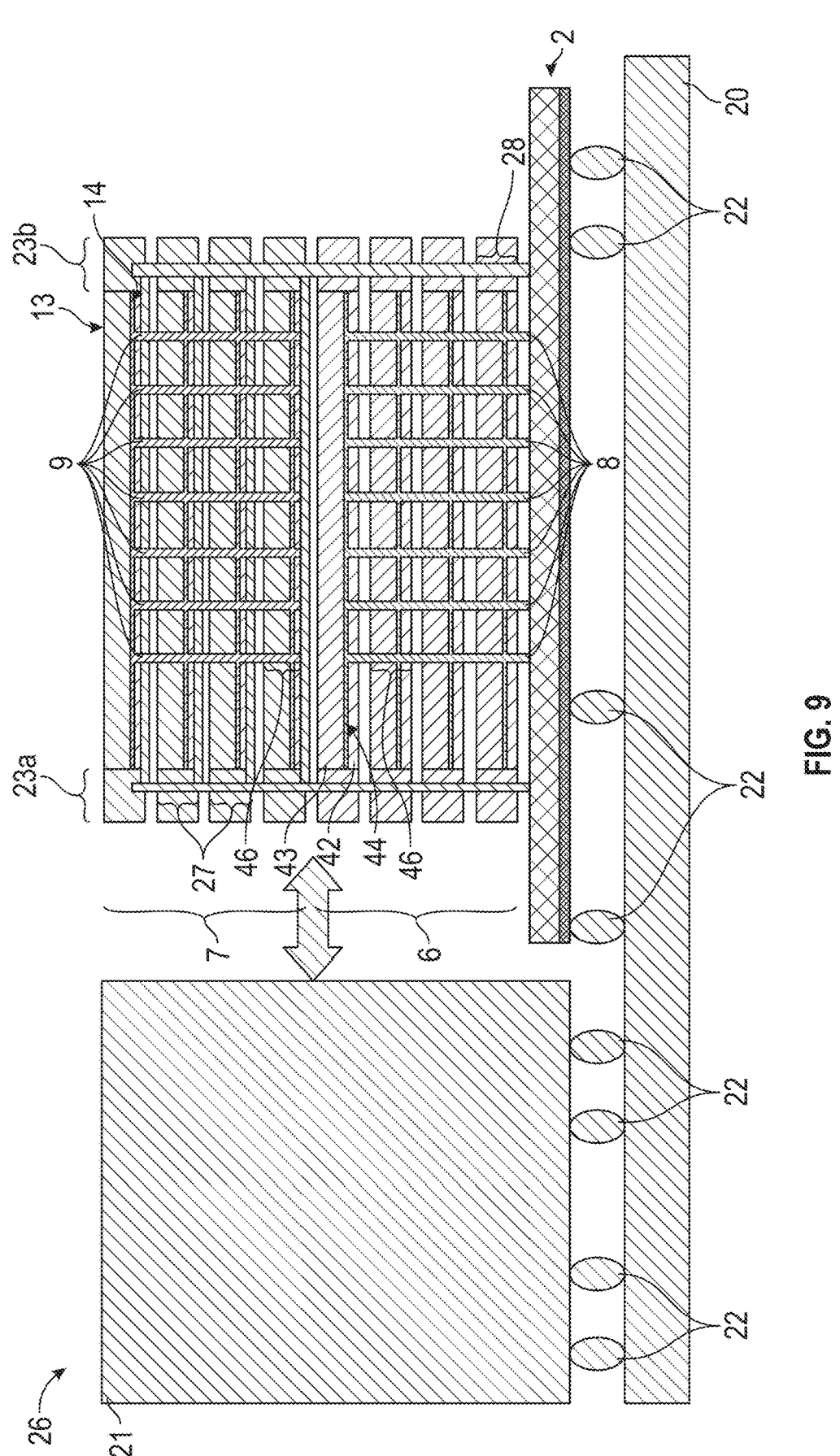
FIG. 9 is a schematic side sectional view of a first stacked assembly including a first plurality of integrated device dies, a second stacked assembly disposed over the first stacked assembly and including a second plurality of integrated device dies, a first plurality of TSVs comprising a first channel, a second plurality of TSVs comprising a second channel, a processor or logic die, dicing lanes, signal TSVs disposed in dicing lanes on one side of the stack, additional TSVs disposed in dicing lanes on an opposing side of the stack, a carrier, and a substrate, according to one embodiment.

FIG. 9 is a schematic side sectional view of a stacked electronic device 26, according to another embodiment. Unless otherwise noted, the components and concepts described herein in connection with FIG. 9 may be the same as or generally similar to the components and concepts described above in connection with FIG. 8. In FIG. 9, some signal TSVs 27 can be disposed through dicing lanes 23*a* on one side of the stack, and additional TSVs 28 can be disposed through dicing lanes 23*b* on an opposing side of the stack.

For example, in various embodiments, each channel 8, 9 in the stacked device 26 can comprise a plurality of signal lines, including fast signal lines and slow signal lines, in addition to power connections, ground connections, testing interconnections, and/or other connections. In some embodiments, the faster signal lines can be disposed along the physically shorter pathways (e.g., signal TSV inputs/outputs (I/O's) pathway 27 in FIG. 9), while the slower signal lines can be disposed along the physically longer pathways (e.g., remaining TSV I/O's pathway 28 in FIG. 9). In some embodiments, power can be supplied along power supply lines on the left side of the stack.

Figure 10:
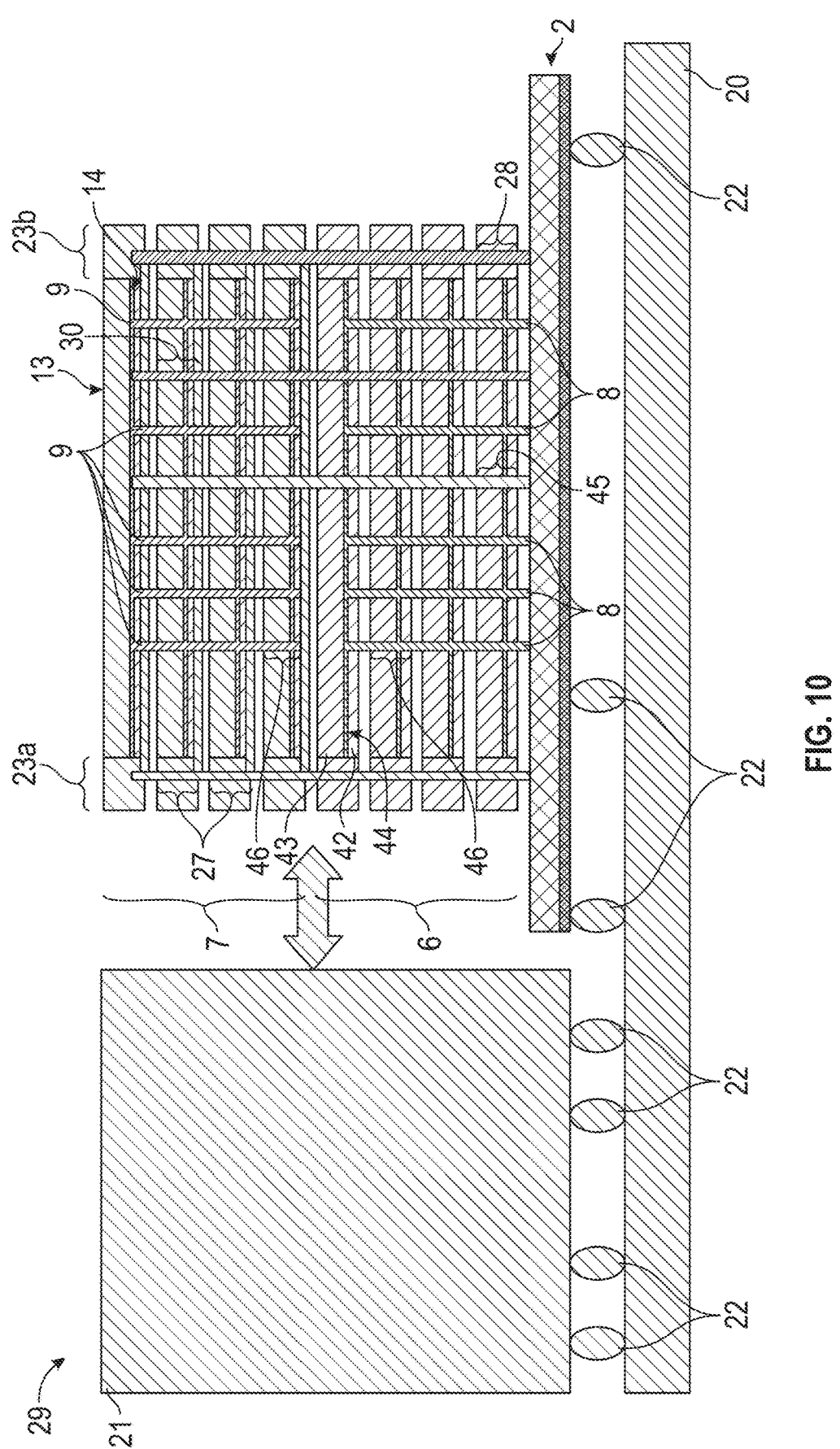
FIG. 10 is a schematic side sectional view of a first stacked assembly including a first plurality of integrated device dies, a second stacked assembly disposed over the first stacked assembly and including a second plurality of integrated device dies, a first plurality of TSVs comprising a first channel, a second plurality of TSVs comprising a second channel, a processor or logic die, dicing lanes, signal TSVs disposed in dicing lanes on one side of the stack, additional TSVs disposed in dicing lanes on an opposing side of the stack, power and/or ground TSVs through the first and second stacked assemblies, a carrier, and a substrate, according to one embodiment.

FIG. 10 is a schematic side sectional view of a stacked electronic device 29, according to another embodiment. Unless otherwise noted, the components and concepts described herein in connection with FIG. 10 may be the same as or generally similar to the components and concepts described above in connection with FIG. 9. In FIG. 10, additional TSVs, or shared TSVs for power 30 and ground 45, can be provided through both die stacks (e.g., through die stacks 6 and 7) in order to provide power and/or ground connections to the dies of the device 29. The stacked device 29 of FIG. 10 can utilize common power and/or ground pathways, such that the dies of die stacks 6 and 7 can each access power through power channels 30 and ground channels 45.

Figure 11:
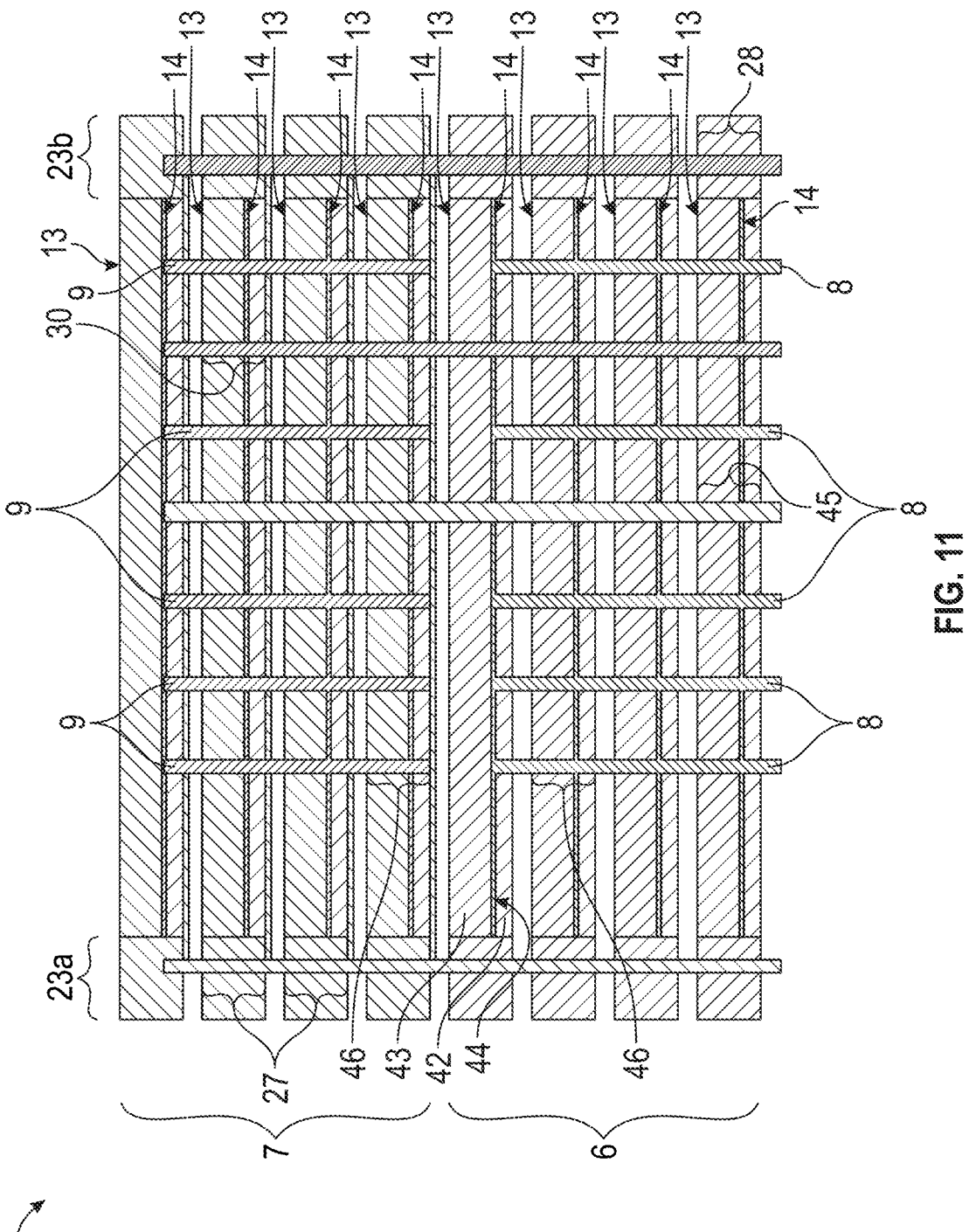
FIG. 11 is a schematic side sectional view of a first stacked assembly including a first plurality of integrated device dies, a second stacked assembly disposed over the first stacked assembly and including a second plurality of integrated device dies, a first plurality of TSVs comprising a first channel, a second plurality of TSVs comprising a second channel, dicing lanes, signal TSVs disposed in dicing lanes on one side of the stack, additional TSVs disposed in dicing lanes on an opposing side of the stack, and power and/or ground TSVs through the first and second stacked assemblies, according to one embodiment.

FIG. 11 illustrates a three-dimensional integrated circuit (3DIC) stack of dies 31 similar to the stack shown in FIG. 10, stacked together to include two channels 8, 9 as explained above. The dies of FIG. 11 can be stacked and directly bonded together, and the stacked structure can be mounted to a carrier in some embodiments. In some embodiments, the stack 31 can be direct hybrid bonded to the carrier. In other embodiments, the stack 31 can be attached to the carrier with a conductive adhesive, such as solder.

Figure 12:
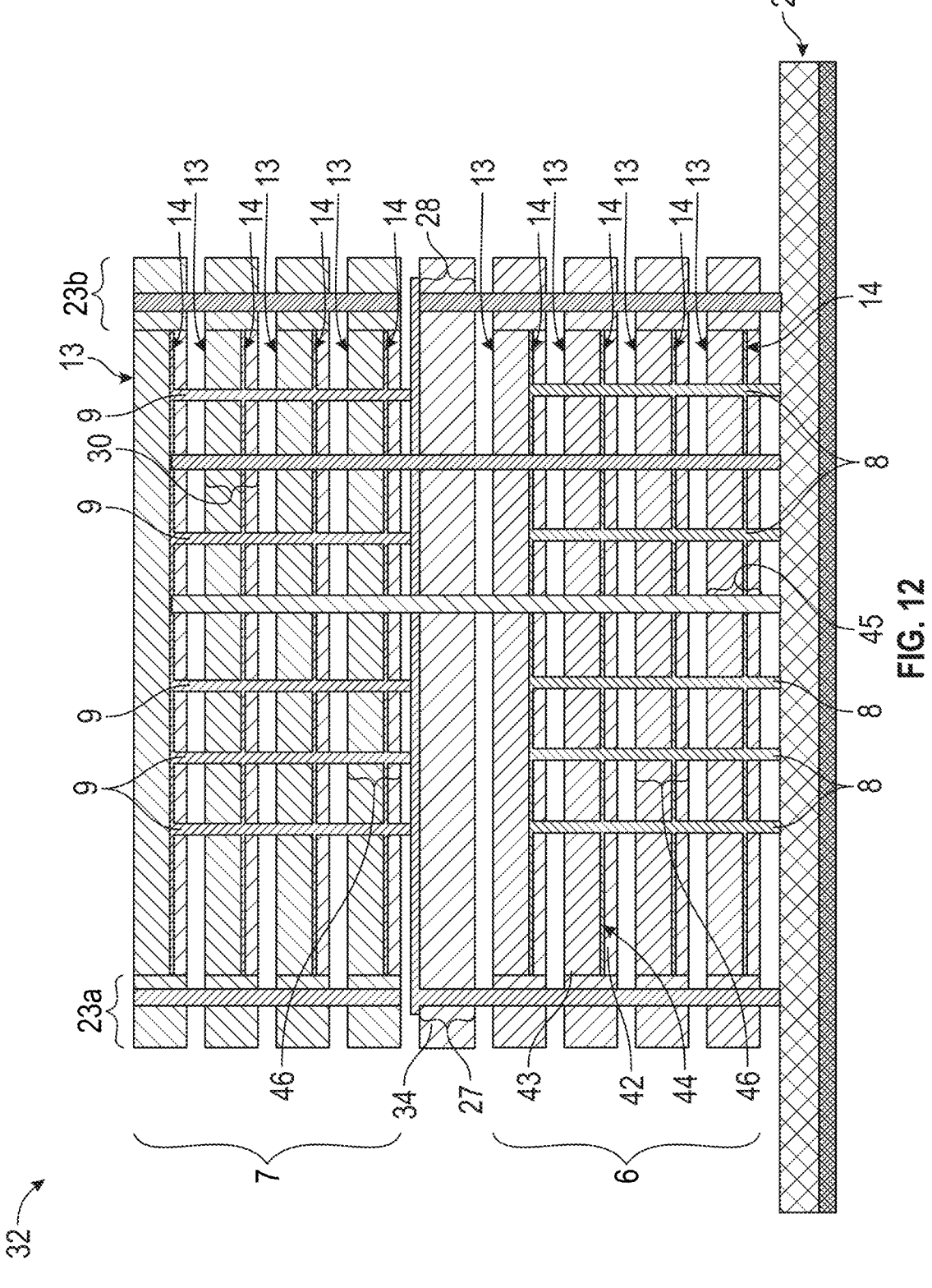
FIG. 12 is a schematic side sectional view of a first stacked assembly including a first plurality of integrated device dies, a second stacked assembly disposed over the first stacked assembly and including a second plurality of integrated device dies, a first plurality of TSVs comprising a first channel, a second plurality of TSVs comprising a second channel, dicing lanes, signal TSVs disposed in dicing lanes on one side of the stack, additional TSVs disposed in dicing lanes on an opposing side of the stack, power and/or ground TSVs through the first and second stacked assemblies, a carrier, and an interposer, according to one embodiment.
Figure 13:
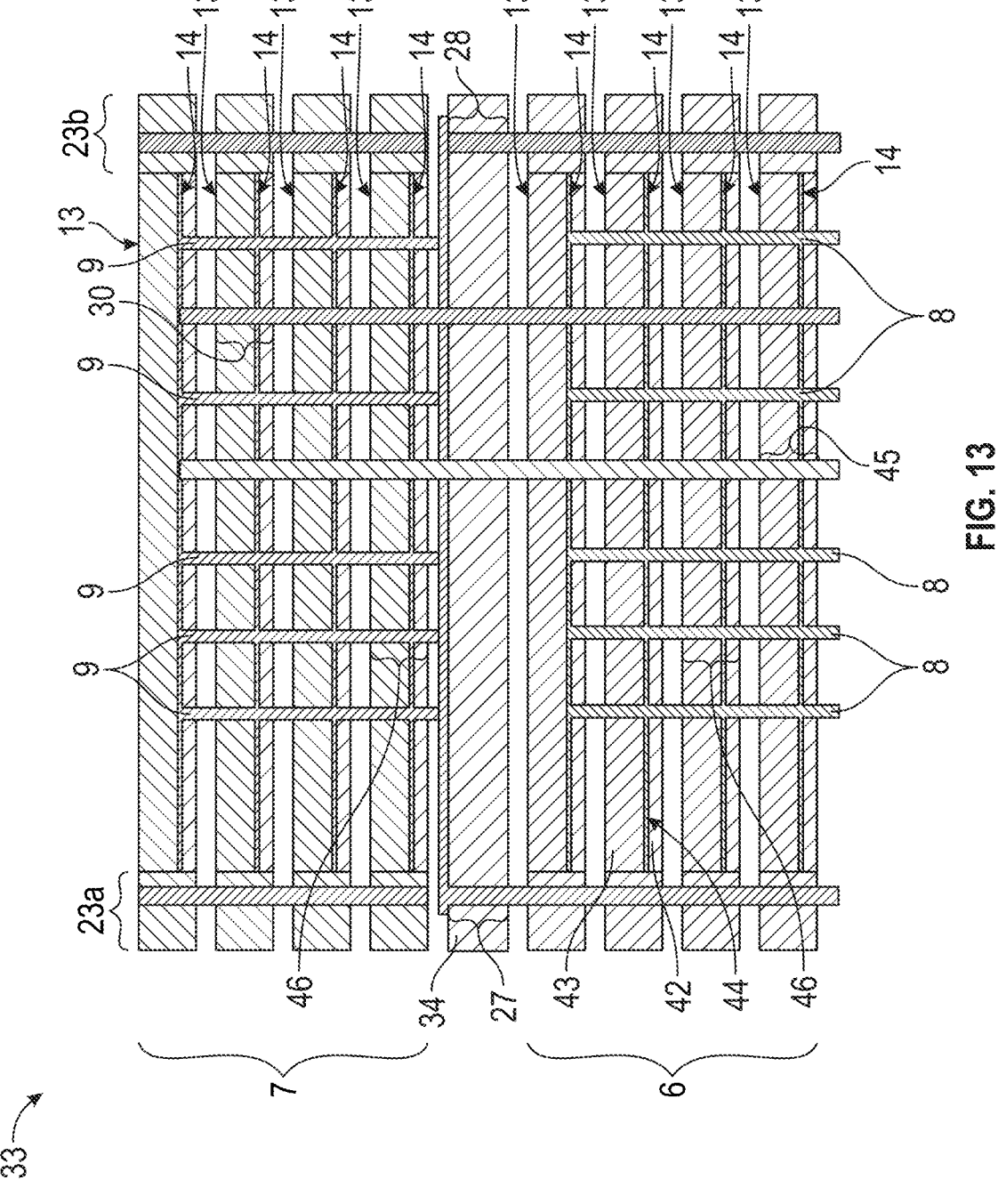
FIG. 13 is a schematic side sectional view of a first stacked assembly including a first plurality of integrated device dies, a second stacked assembly disposed over the first stacked assembly and including a second plurality of integrated device dies, a first plurality of TSVs comprising a first channel, a second plurality of TSVs comprising a second channel, dicing lanes, signal TSVs disposed in dicing lanes on one side of the stack, additional TSVs disposed in dicing lanes on an opposing side of the stack, power and/or ground TSVs through the first and second stacked assemblies, and an interposer, according to one embodiment.

FIG. 12 is a schematic side sectional view of a stacked electronic device 32, according to another embodiment. FIG. 13 illustrates a three-dimensional integrated circuit (3DIC) stack of dies 33 of the device 32 of FIG. 12 stacked together to include two channels 8, 9. Unless otherwise noted, the components and concepts described herein in connection with FIGS. 12-13 may be the same as or generally similar to the components and concepts described above in connection with FIGS. 2-11. In FIGS. 12-13, an interposer 34 can be disposed between the die stacks 6, 7. TSVs 27, 28 through the interposer 34 can electrically connect the channel I/O's 9 to the upper stack of dies 7. The interposer 34 can comprise any suitable type of structure, such as a semiconductor interposer with patterned metallic vias and traces, a package substrate, a ceramic substrate, etc.

Figure 14:
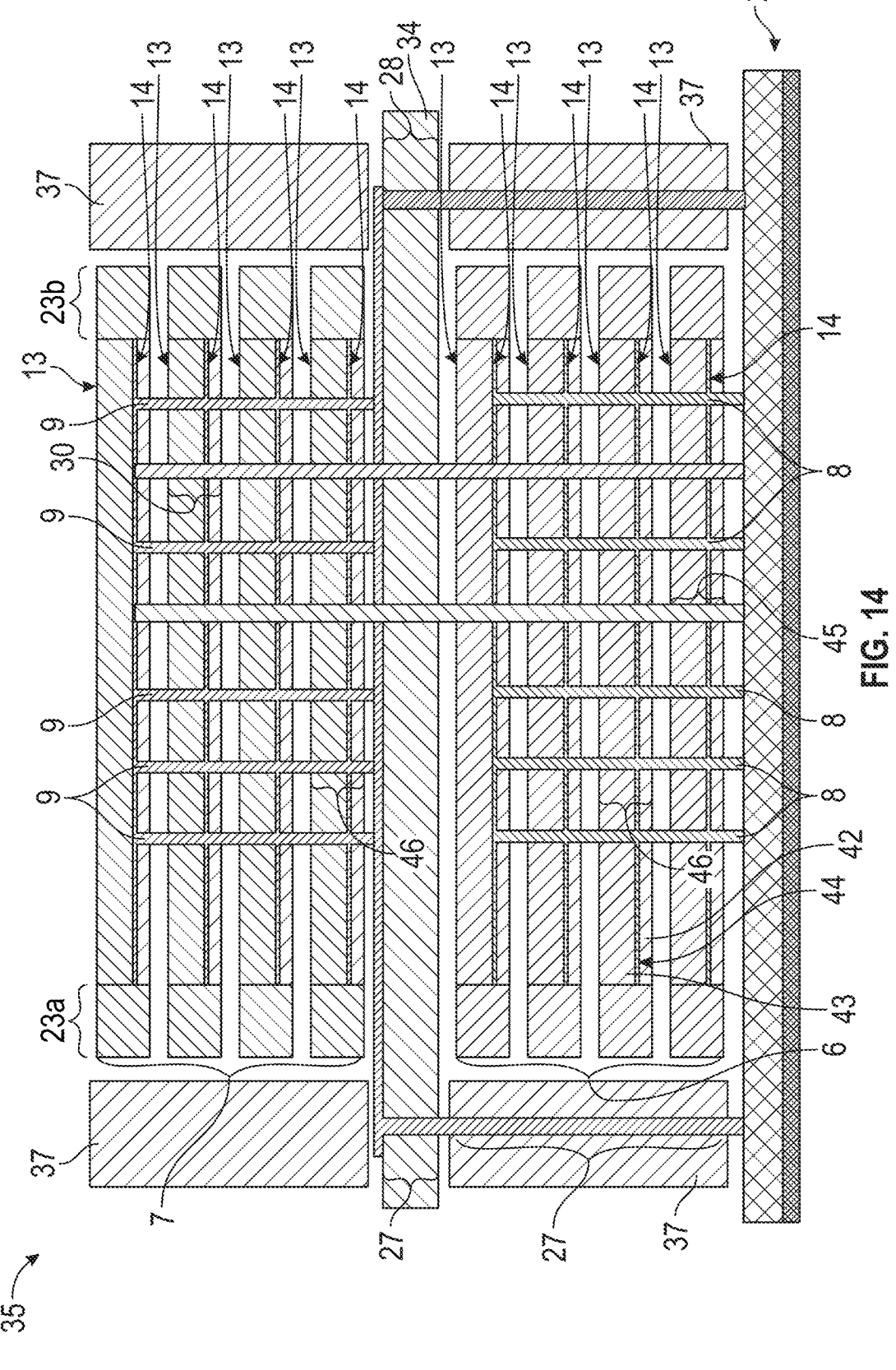
FIG. 14 is a schematic side sectional view of a first stacked assembly including a first plurality of integrated device dies, a second stacked assembly disposed over the first stacked assembly and including a second plurality of integrated device dies, a first plurality of TSVs comprising a first channel, a second plurality of TSVs comprising a second channel, dicing lanes, a plurality of dummy dies, signal TSVs disposed through a lower dummy die on one side of the stack, additional TSVs disposed through a lower dummy die on an opposing side of the stack, power and/or ground TSVs through the first and second stacked assemblies, a carrier, and an interposer, according to one embodiment.
Figure 15:
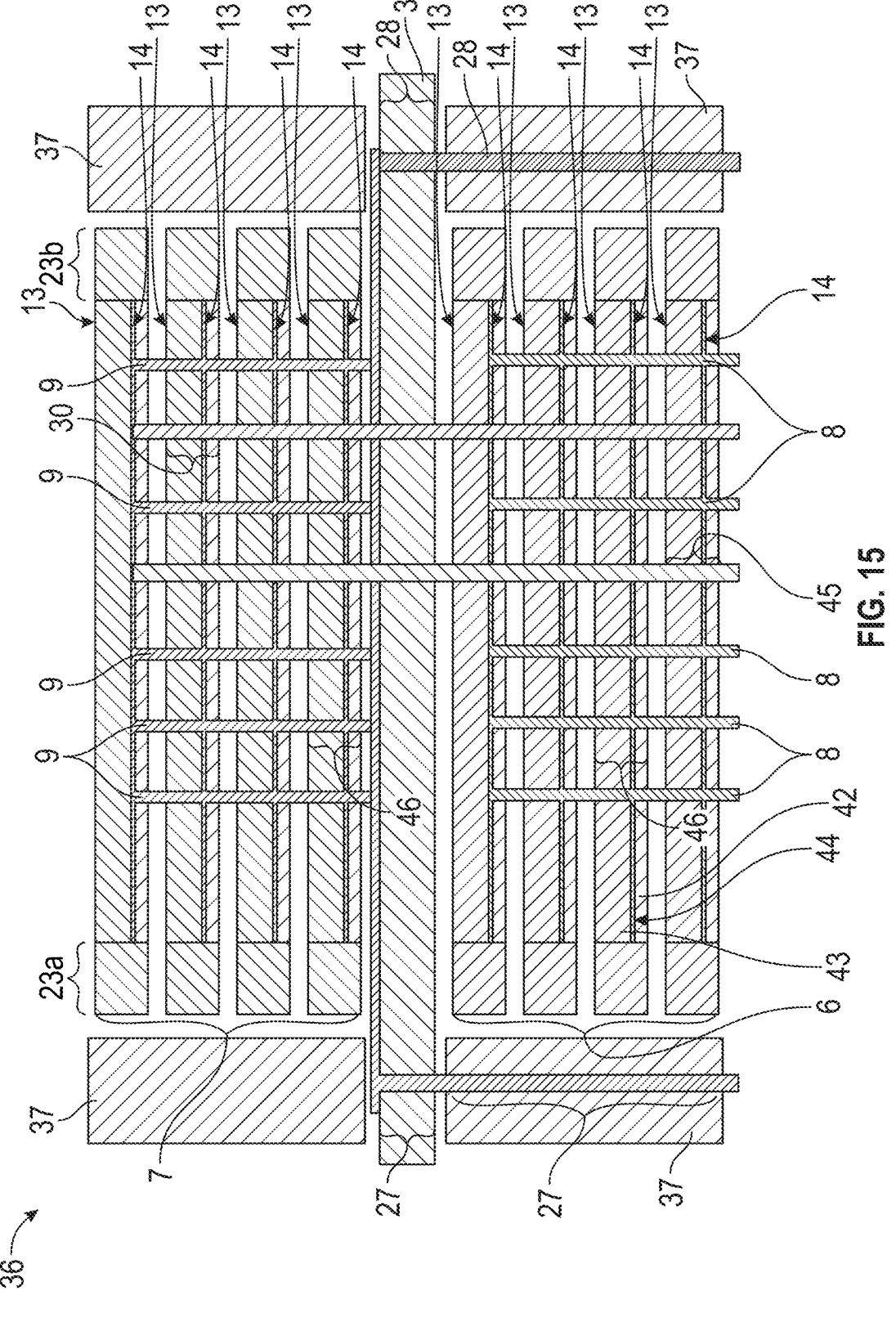
FIG. 15 is a schematic side sectional view of a first stacked assembly including a first plurality of integrated device dies, a second stacked assembly disposed over the first stacked assembly and including a second plurality of integrated device dies, a first plurality of TSVs comprising a first channel, a second plurality of TSVs comprising a second channel, dicing lanes, a plurality of dummy dies, signal TSVs disposed through a lower dummy die on one side of the stack, additional TSVs disposed through a lower dummy die on an opposing side of the stack, power and/or ground TSVs through the first and second stacked assemblies, and an interposer, according to one embodiment.

FIG. 14 is a schematic side sectional view of a stacked electronic device 35, according to another embodiment. FIG. 15 illustrates a three-dimensional integrated circuit (3DIC) stack of dies 36 of the device 35 of FIG. 14 stacked together to include two channels 8, 9. Unless otherwise noted, the components and concepts described herein in connection with FIGS. 14-15 may be the same as or generally similar to the components and concepts described above in connection with FIGS. 2-13. In FIGS. 14-15, instead of providing the TSVs 27, 28 through dicing lanes 23*a*, 23*b* at an outer periphery of the dies, one or more dummy dies 37 (which may be devoid of active circuitry) can be provided outside a perimeter of the active dies. TSVs 27, 28 can be provided through the lower dummy die(s) and the interposer 34 to connect to the upper set of dies 7 connected to signal channels 9.

Figures 16A, 16B:
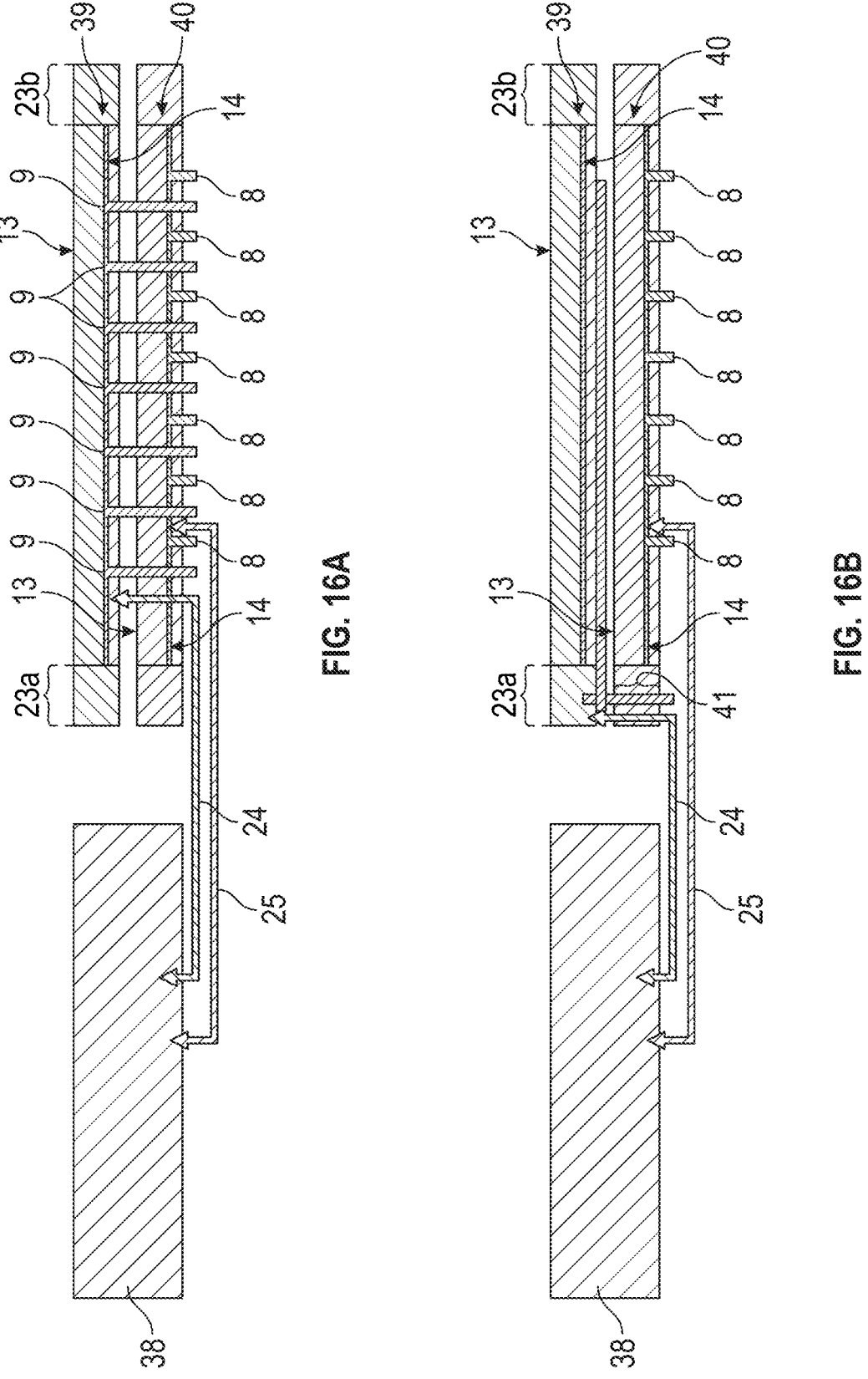
FIG. 16A is a schematic side sectional view of a first stacked assembly including a first integrated device die, a second stacked assembly disposed over the first stacked assembly and including a second integrated device die, a first plurality of TSVs comprising a first channel, a second plurality of TSVs comprising a second channel, a first channel pathway, a second channel pathway, a logic die, and dicing lanes, according to one embodiment.
FIG. 16B is a schematic side sectional view of a first stacked assembly including a first integrated device die, a second stacked assembly disposed over the first stacked assembly and including a second integrated device die, a first plurality of TSVs comprising a first channel, a first channel pathway, a second channel pathway, a logic die, dicing lanes, and a TSV disposed in the dicing lanes, according to one embodiment.
Figures 16C, 16D:
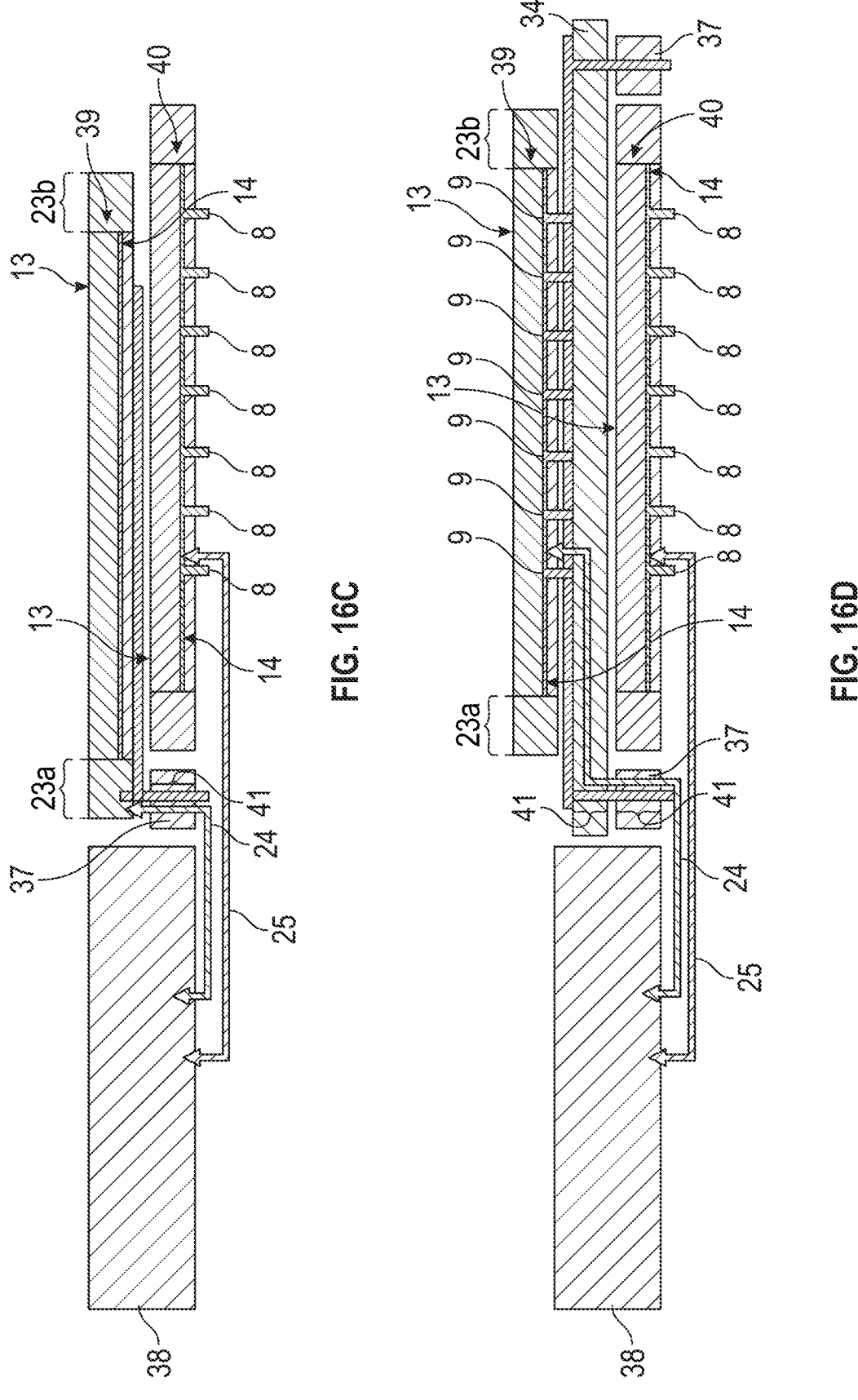
FIG. 16C is a schematic side sectional view of a first stacked assembly including a first integrated device die, a second stacked assembly disposed over the first stacked assembly and including a second integrated device die, a first plurality of TSVs comprising a first channel, a first channel pathway, a second channel pathway, a logic die, dicing lanes, a dummy die, and a TSV disposed in the dummy die, according to one embodiment.
FIG. 16D is a schematic side sectional view of a first stacked assembly including a first integrated device die, a second stacked assembly disposed over the first stacked assembly and including a second integrated device die, a first plurality of TSVs comprising a first channel, a second plurality of TSVs comprising a second channel, a first channel pathway, a second channel pathway, a logic die, dicing lanes, an interposer, a plurality of dummy dies, and a plurality of TSVs disposed in the dummy dies, according to one embodiment.

FIGS. 16A-16D are example architectures schematically illustrating a connection between a logic chip 38 and a set of first and second stacked dies (e.g., a first die 39 stacked on a second die 40). Although FIGS. 16A-16D show two dies 39, 40 in the stack, in other embodiments, multiple dies can be provided in multiple stacks as shown above. In FIG. 16A, the logic die 38 can connect to the first 39 and second 40 dies independently by way of respective arrays of TSVs 46, such that the signals between a first channel pathway 24 and a second channel pathway 25 are not shared. In FIG. 16B, the logic die 38 can connect to the first 39 and second 40 dies independently with the first channel pathway 24 connecting to the upper die 39 by way of TSV(s) 41 (e.g., the first channel pathway 24 passes through TSV(s) 41) through the dicing lane 23*a*, such that the signals between the first channel pathway 24 and the second channel pathway 25 are not shared. In FIG. 16C, the logic die 38 can connect to the first 39 and second 40 dies independently with the first channel pathway 24 connecting to the upper die 39 by way of TSV(s) 41 (e.g., the first channel pathway 24 passes through TSV(s) 41) provided through a dummy die 37, such that the signals between the first channel pathway 24 and the second channel pathway 25 are not shared. In FIG. 16D, the logic die 38 can connect to the first 39 and second 40 dies independently with the first channel pathway 24 connecting to the upper die 39 by way of TSV(s) 41 (e.g., the first channel pathway 24 passes through TSV(s) 41) provided through a dummy die 37 and an interposer 34, such that the signals between the first channel pathway 24 and the second channel pathway 25 are not shared.

Examples of Direct Bonding Methods and Directly Bonded Structures

Figures 17A, 17B:
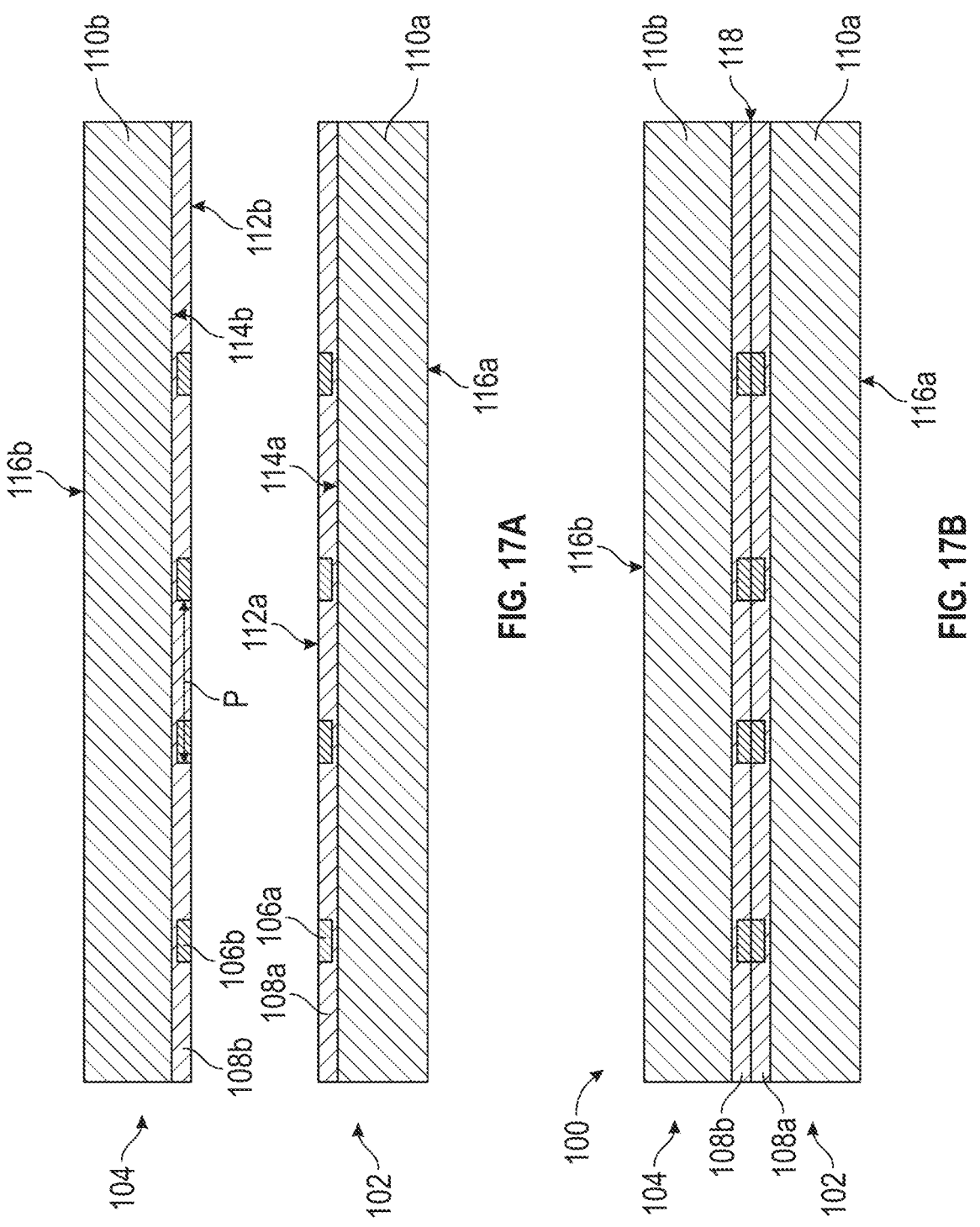
FIG. 17A is a schematic side sectional view of a first microelectronic element and a second microelectronic element.
FIG. 17B is a schematic side sectional view of a first microelectronic element and a second microelectronic element directly hybrid bonded to one another.

Various embodiments disclosed herein relate to directly bonded structures in which two or more elements can be directly bonded to one another without an intervening adhesive. FIGS. 17A and 17B schematically illustrate a process for forming a direct hybrid bonded structure without an intervening adhesive according to some embodiments. In FIGS. 17A and 17B, a bonded structure 100 comprises two elements 102 and 104 that can be directly bonded to one another at a bond interface 118 without an intervening adhesive. Two or more microelectronic elements 102 and 104 (such as semiconductor elements, including, for example, integrated device dies, wafers, passive devices, individual active devices such as power switches, etc.) may be stacked on or bonded to one another to form the bonded structure 100. Conductive features 106*a* (e.g., contact pads, exposed ends of vias (e.g., TSVs), or through substrate electrodes) of a first element 102 may be electrically connected to corresponding conductive features 106*b* of a second element 104. Any suitable number of elements can be stacked in the bonded structure 100. For example, a third element (not shown) can be stacked on the second element 104, a fourth element (not shown) can be stacked on the third element, and so forth. Additionally, or alternatively, one or more additional elements (not shown) can be stacked laterally adjacent one another along the first element 102. In some embodiments, the laterally stacked additional element may be smaller than the second element. In some embodiments, the laterally stacked additional element may be two times smaller than the second element.

In some embodiments, the elements 102 and 104 are directly bonded to one another without an adhesive. In various embodiments, a non-conductive field region that includes a non-conductive or dielectric material can serve as a first bonding layer 108a of the first element 102 which can be directly bonded to a corresponding non-conductive field region that includes a non-conductive or dielectric material serving as a second bonding layer 108b of the second element 104 without an adhesive. The non-conductive bonding layers 108a and 108b can be disposed on respective front sides 114a and 114b of device portions 110a and 110b, such as a semiconductor (e.g., silicon) portion of the elements 102, 103. Active devices and/or circuitry can be patterned and/or otherwise disposed in or on the device portions 110a and 110b. Active devices and/or circuitry can be disposed at or near the front sides 114a and 114b of the device portions 110a and 110b, and/or at or near opposite backsides 116a and 116b of the device portions 110a and 110b. Bonding layers can be provided on front sides and/or back sides of the elements. The non-conductive material can be referred to as a non-conductive bonding region or bonding layer 108a of the first element 102. In some embodiments, the non-conductive bonding layer 108a of the first element 102 can be directly bonded to the corresponding non-conductive bonding layer 108b of the second element 104 using dielectric-to-dielectric bonding techniques. For example, non-conductive or dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. It should be appreciated that in various embodiments, the bonding layers 108a and/or 108b can comprise a non-conductive material such as a dielectric material, such as silicon oxide, or an undoped semiconductor material, such as undoped silicon. Suitable dielectric bonding surface or materials for direct bonding include but are not limited to inorganic dielectrics, such as silicon oxide, silicon nitride, or silicon oxynitride, or can include carbon, such as silicon carbide, silicon oxycarbonitride, low K dielectric materials, SiCOH dielectrics, silicon carbonitride or diamond-like carbon or a material comprising a diamond surface. Such carbon-containing ceramic materials can be considered inorganic, despite the inclusion of carbon. In some embodiments, the dielectric materials do not comprise polymer materials, such as epoxy, resin or molding materials.

In some embodiments, the device portions 110a and 110b can have a significantly different coefficients of thermal expansion (CTEs) defining a heterogenous structure. The CTE difference between the device portions 110a and 110b, and particularly between bulk semiconductor, typically single crystal portions of the device portions 110a, 110b, can be greater than 5 ppm or greater than 10 ppm. For example, the CTE difference between the device portions 110a and 110b can be in a range of 5 ppm to 100 ppm, 5 ppm to 40 ppm, 10 ppm to 100 ppm, or 10 ppm to 40 ppm. In some embodiments, one of the device portions 110a and 110b can comprise optoelectronic single crystal materials, including perovskite materials, that are useful for optical piezoelectric or pyroelectric applications, and the other of the device portions 110a, 110b comprises a more conventional substrate material. For example, one of the device portions 110a, 110b comprises lithium tantalate (LiTaO3) or lithium niobate (LiNbO3), and the other one of the device portions 110a, 110b comprises silicon (Si), quartz, fused silica glass, sapphire, or a glass. In other embodiments, one of the device portions 110a and 110b comprises a III-V single semiconductor material, such as gallium arsenide (GaAs) or gallium nitride (GaN), and the other one of the device portions 110a and 110b can comprise a non-III-V semiconductor material, such as silicon (Si), or can comprise other materials with similar CTE, such as quartz, fused silica glass, sapphire, or a glass.

In various embodiments, direct hybrid bonds can be formed without an intervening adhesive. For example, non-conductive bonding surfaces 112a and 112b can be polished to a high degree of smoothness. The non-conductive bonding surfaces 112a and 112b can be polished using, for example, chemical mechanical polishing (CMP). The roughness of the polished bonding surfaces 112a and 112b can be less than 30 Å rms. For example, the roughness of the bonding surfaces 112a and 112b can be in a range of about 0.1 Å rms to 15 Å rms, 0.5 Å rms to 10 Å rms, or 1 Å rms to 5 Å rms. The bonding surfaces 112a and 112b can be cleaned and exposed to a plasma and/or etchants to activate the surfaces 112a and 112b. In some embodiments, the surfaces 112a and 112b can be terminated with a species after activation or during activation (e.g., during the plasma and/or etch processes). Without being limited by theory, in some embodiments, the activation process can be performed to break chemical bonds at the bonding surfaces 112a and 112b, and the termination process can provide additional chemical species at the bonding surfaces 112a and 112b that improves the bonding energy during direct bonding. In some embodiments, the activation and termination are provided in the same step, e.g., a plasma to activate and terminate the surfaces 112a and 112b. In other embodiments, the bonding surfaces 112a and 112b can be terminated in a separate treatment to provide the additional species for direct bonding. In various embodiments, the terminating species can comprise nitrogen. For example, in some embodiments, the bonding surface(s) 112a, 112b can be exposed to a nitrogen-containing plasma. Further, in some embodiments, the bonding surfaces 112a and 112b can be exposed to fluorine. For example, there may be one or multiple fluorine peaks at or near a bond interface 118 between the first and second elements 102, 104. Thus, in the directly bonded structure 100, the bond interface 118 between two non-conductive materials (e.g., the bonding layers 108a and 108b) can comprise a very smooth interface with higher nitrogen content and/or fluorine peaks at the bond interface 118. Additional examples of activation and/or termination treatments may be found throughout U.S. Pat. Nos. 9,564,414; 9,391,143; and 10,434,749, the entire contents of each of which are incorporated by reference herein in their entirety and for all purposes. The roughness of the polished bonding surfaces 112a and 112b can be slightly rougher (e.g., about 1 Å rms to 30 Å rms, 3 Å rms to 20 Å rms, or possibly rougher) after an activation process.

In various embodiments, conductive features 106a of the first element 102 can also be directly bonded to corresponding conductive features 106b of the second element 104. For example, a direct hybrid bonding technique can be used to provide conductor-to-conductor direct bonds along the bond interface 118 that includes covalently direct bonded non-conductive-to-non-conductive (e.g., dielectric-to-dielectric) surfaces, prepared as described above. In various embodiments, the conductor-to-conductor (e.g., conductive feature 106a to conductive feature 106b) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes. In direct hybrid bonding embodiments described herein, conductive features are provided within non-conductive bonding layers, and both conductive and non-conductive features are prepared for direct bonding, such as by the planarization, activation and/or termination treatments described above. Thus, the bonding surface prepared for direct bonding includes both conductive and non-conductive features.

For example, non-conductive (e.g., dielectric) bonding surfaces 112a, 112b (for example, inorganic dielectric surfaces) can be prepared and directly bonded to one another without an intervening adhesive as explained above. Conductive contact features (e.g., conductive features 106a and 106b which may be at least partially surrounded by non-conductive dielectric field regions within the bonding layers 108a, 108b) may also directly bond to one another without an intervening adhesive. In various embodiments, the conductive features 106a, 106b can comprise discrete pads or traces at least partially embedded in the non-conductive field regions. In some embodiments, the conductive contact features can comprise exposed contact surfaces of through substrate vias (e.g., through silicon vias (TSVs)). In some embodiments, the respective conductive features 106a and 106b can be recessed below exterior (e.g., upper) surfaces (non-conductive bonding surfaces 112a and 112b) of the dielectric field region or non-conductive bonding layers 108a and 108b, for example, recessed by less than 30 nm, less than 20 nm, less than 15 nm, or less than 10 nm, for example, recessed in a range of 2 nm to 20 nm, or in a range of 4 nm to 10 nm. In various embodiments, prior to direct bonding, the recesses in the opposing elements can be sized such that the total gap between opposing contact pads is less than 15 nm, or less than 10 nm. The non-conductive bonding layers 108a and 108b can be directly bonded to one another without an adhesive at room temperature in some embodiments and, subsequently, the bonded structure 100 can be annealed. Upon annealing, the conductive features 106a and 106b can expand and contact one another to form a metal-to-metal direct bond. Beneficially, the use of Direct Bond Interconnect, or DBI®, techniques commercially available from Adeia of San Jose, CA, can enable high density of conductive features 106a and 106b to be connected across the direct bond interface 118 (e.g., small or fine pitches for regular arrays). In some embodiments, the pitch of the conductive features 106a and 106b, such as conductive traces embedded in the bonding surface of one of the bonded elements, may be less than 100 microns or less than 10 microns or even less than 2 microns. For some applications, the ratio of the pitch of the conductive features 106a and 106b to one of the dimensions (e.g., a diameter) of the bonding pad is less than 20, or less than 10, or less than 5, or less than 3 and sometimes desirably less than 2. In other applications, the width of the conductive traces embedded in the bonding surface of one of the bonded elements may range between 0.3 to 20 microns (e.g., in a range of 0.3 to 3 microns). In various embodiments, the conductive features 106a and 106b and/or traces can comprise copper or copper alloys, although other metals may be suitable. For example, the conductive features disclosed herein, such as the conductive features 106a and 106b, can comprise fine-grain metal (e.g., a fine-grain copper).

Thus, in direct bonding processes, a first element 102 can be directly bonded to a second element 104 without an intervening adhesive. In some arrangements, the first element 102 can comprise a singulated element, such as a singulated integrated device die. In other arrangements, the first element 102 can comprise a carrier or substrate (e.g., a wafer) that includes a plurality (e.g., tens, hundreds, or more) of device regions that, when singulated, form a plurality of integrated device dies. Similarly, the second element 104 can comprise a singulated element, such as a singulated integrated device die. In other arrangements, the second element 104 can comprise a carrier or substrate (e.g., a wafer). The embodiments disclosed herein can accordingly apply to wafer-to-wafer (W2W), die-to-die (D2D), or die-to-wafer (D2W) bonding processes. In wafer-to-wafer (W2W) processes, two or more wafers can be directly bonded to one another (e.g., direct hybrid bonded) and singulated using a suitable singulation process. After singulation, side edges of the singulated structure (e.g., the side edges of the two bonded elements) may be substantially flush and may include markings indicative of the common singulation process for the bonded structure (e.g., saw markings if a saw singulation process is used).

As explained herein, the first and second elements 102 and 104 can be directly bonded to one another without an adhesive, which is different from a deposition process and results in a structurally different interface compared to a deposition. In one application, a width of the first element 102 in the bonded structure is similar to a width of the second element 104. In some other embodiments, a width of the first element 102 in the bonded structure 100 is different from a width of the second element 104. Similarly, the width or area of the larger element in the bonded structure may be at least 10% larger than the width or area of the smaller element. The first and second elements 102 and 104 can accordingly comprise non-deposited elements. Further, directly bonded structures 100, unlike deposited layers, can include a defect region along the bond interface 118 in which nanometer-scale voids (nanovoids) are present. The nanovoids may be formed due to activation of the bonding surfaces 112a and 112b (e.g., exposure to a plasma). As explained above, the bond interface 118 can include concentration of materials from the activation and/or last chemical treatment processes. For example, in embodiments that utilize a nitrogen plasma for activation, a nitrogen peak can be formed at the bond interface 118. The nitrogen peak can be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with $NH_2$ molecules, yielding a nitrogen-terminated surface. In embodiments that utilize an oxygen plasma for activation, an oxygen peak can be formed at the bond interface 118. In some embodiments, the bond interface 118 can comprise silicon oxynitride, silicon oxycarbonitride, or silicon carbonitride. As explained herein, the direct bond can comprise a covalent bond, which is stronger than van Der Waals bonds. The bonding layers 108a and 108b can also comprise polished surfaces that are planarized to a high degree of smoothness.

In various embodiments, the metal-to-metal bonds between the conductive features 106a and 106b can be joined such that metal grains grow into each other across the bond interface 118. In some embodiments, the metal is or includes copper, which can have grains oriented along the (111) crystal plane for improved copper diffusion across the bond interface 118. In some embodiments, the conductive features 106a and 106b may include nanotwinned copper grain structure, which can aid in merging the conductive features during annealing. The bond interface 118 can extend substantially entirely to at least a portion of the bonded conductive features 106a and 106b, such that there is substantially no gap between the non-conductive bonding layers 108a and 108b at or near the bonded conductive features 106a and 106b. In some embodiments, a barrier layer may be provided under and/or laterally surrounding the conductive features 106a and 106b (e.g., which may include copper). In other embodiments, however, there may be no barrier layer under the conductive features 106a and 106b, for example, as described in U.S. Pat. No. 11,195,748, which is incorporated by reference herein in its entirety and for all purposes.

Beneficially, the use of the hybrid bonding techniques described herein can enable extremely fine pitch between adjacent conductive features 106a and 106b, and/or small pad sizes. For example, in various embodiments, the pitch p (i.e., the distance from edge-to-edge or center-to-center, as shown in FIG. 17A) between adjacent conductive features 106a (or 106b) can be in a range of 0.5 microns to 50 microns, in a range of 0.75 microns to 25 microns, in a range of 1 micron to 25 microns, in a range of 1 micron to 10 microns, or in a range of 1 micron to 5 microns. Further, a major lateral dimension (e.g., a pad diameter) can be small as well, e.g., in a range of 0.25 microns to 30 microns, in a range of 0.25 microns to 5 microns, or in a range of 0.5 microns to 5 microns.

As described above, the non-conductive bonding layers 108a, 108b can be directly bonded to one another without an adhesive and, subsequently, the bonded structure 100 can be annealed. Upon annealing, the conductive features 106a, 106b can expand and contact one another to form a metal-to-metal direct bond. In some embodiments, the materials of the conductive features 106a, 106b can interdiffuse during the annealing process.

Example Embodiments of Multi-Channel Device Stacking

In one embodiment, an electronic device can include a first stacked assembly including a first plurality of integrated device dies, wherein the first plurality of integrated device dies comprises a first integrated device die; a second stacked assembly including a second plurality of device dies, wherein the second stacked assembly is disposed over the first stacked assembly and wherein the second plurality of integrated device dies comprises a second integrated device die; a first channel extending at least partially through the first stacked assembly, wherein the first integrated device die comprises a first circuit and wherein the first channel is connected to the first circuit; and a second channel extending through and bypassing the first stacked assembly, the second channel extending at least partially through the second stacked assembly, wherein the second integrated device die comprises a second circuit and wherein the second channel is connected to the second circuit.

In some embodiments, the first stacked assembly is directly bonded to the second stacked assembly. In some embodiments, the first integrated device die comprises a first non-conductive bonding layer further comprising a first plurality of conductive features and the second integrated device die comprises a second non-conductive bonding layer further comprising a second plurality of conductive features, wherein the first non-conductive bonding layer is directly bonded to the second non-conductive bonding layer and the first plurality of conductive features is directly bonded to the second plurality of conductive features. In some embodiments, the first stacked assembly is bonded to the second stacked assembly using solder. In some embodiments, each of the first plurality of integrated device dies comprises an active circuitry region and wherein at least read and/or write signals of the second channel bypass the active circuitry regions of the first plurality of integrated device dies. In some embodiments, the first stacked assembly includes a dummy die disposed adjacent to the first plurality of integrated device dies and wherein the second channel extends through the dummy die. In some embodiments, the second channel does not extend through the first plurality of integrated device dies. In some embodiments, the second stacked assembly is mounted directly on the first stacked assembly. In some embodiments, the first stacked assembly is direct hybrid bonded to the second stacked assembly. In some embodiments, the electronic device can include an interposer, wherein the second stacked assembly is mounted on the interposer and the interposer is mounted on the first stacked assembly. In some embodiments, the second channel does not extend through the first plurality of integrated device dies. In some embodiments, the second channel extends through the interposer. In some embodiments, the second stacked assembly is direct hybrid bonded to the interposer. In some embodiments, the first channel comprises one or more first interconnects extending at least partially through the first integrated device die, and wherein the second channel comprises one or more second interconnects extending through the second integrated device die. In some embodiments, the one or more second interconnects extend through an active circuitry region of the first integrated device die, the one or more second interconnects electrically bypassing active circuitry of the first integrated device die. In some embodiments, the one or more second interconnects extend through a dicing lane of the first integrated device die. In some embodiments the second channel is configured to convey a first signal along a first pathway and the first channel is configured to convey a second signal along a second pathway that is longer than the first pathway, the first signal having a higher frequency than the second signal. In some embodiments, the first pathway is between the second stacked assembly and a processor die, and the second pathway is between the first stacked assembly and the processor die.

In another embodiment, an electronic device can include: a first integrated device assembly; a second integrated device assembly disposed over the first integrated device assembly; a first channel connected to a first circuit of the first integrated device assembly; and a second channel different from the first channel, wherein the second channel bypasses the first integrated device assembly and is connected to a second circuit of the second integrated device assembly.

In some embodiments, the second integrated device assembly is direct hybrid bonded to the first integrated device assembly. In some embodiments, the second channel extends through the first integrated device assembly. In some embodiments, the first integrated device assembly comprises a plurality of integrated device dies stacked together. In some embodiments, at least two of the plurality of integrated device dies are direct hybrid bonded. In some embodiments, each of the plurality of integrated device dies is direct hybrid bonded to one another. In some embodiments, the second channel extends through the plurality of integrated device dies. In some embodiments, the second channel extends along a side edge of the plurality of integrated device dies. In some embodiments, the first integrated device assembly comprises a dummy die that is disposed adjacent to the plurality of integrated device dies and wherein the second channel extends through the dummy die, and in some embodiments, the second channel does not extend through the plurality of integrated device dies in the first integrated device assembly. In some embodiments, the electronic device can include an interposer positioned between the first and second integrated device assemblies, wherein the second channel extends through the interposer. In some embodiments, the second channel does not extend through the plurality of integrated device dies in the first integrated device assembly. In some embodiments, the second integrated device assembly is direct hybrid bonded to the interposer. In some embodiments, the plurality of integrated device dies comprise a dicing lane and wherein the second channel is disposed within the dicing lane.

In another embodiment, an electronic device can include: a first plurality of integrated device dies; a second plurality of integrated device dies, wherein the first and second pluralities of integrated device dies are stacked together; a first channel extending at least partially through the first and second pluralities of integrated device dies, wherein the first channel is connected to circuitry in the second plurality of integrated device dies and bypasses circuitry in the first plurality of integrated device dies; and a second channel extending at least partially through the first and second pluralities of integrated device dies, wherein the second channel is connected to circuitry in the first plurality of integrated device dies.

In some embodiments, at least two of the first plurality of integrated device dies are direct hybrid bonded and at least two of the second plurality of integrated device dies are direct hybrid bonded. In some embodiments, each die of the first plurality of integrated device dies is direct hybrid bonded to another die of the first plurality of integrated device dies and each die of the second plurality of integrated device dies is direct hybrid bonded to another die of the second plurality of integrated device dies. In some embodiments, the first and second pluralities of integrated device dies are stacked together such that the integrated device dies of the first plurality of integrated device dies are interleaved with the integrated device dies of the second plurality of integrated device dies. In some embodiments, a die of the first plurality of integrated device dies is direct hybrid bonded to a die of the second plurality of integrated device dies. In some embodiments, the first plurality of integrated device dies are stacked together to form a first integrated device assembly, the second plurality of integrated device dies stacked together to form a second integrated device assembly, and the second integrated device assembly is disposed over the first integrated device assembly. In some embodiments, the first integrated device assembly is direct hybrid bonded to the second integrated device assembly. In some embodiments, each of the first plurality of integrated device dies comprises at least one dicing lane and wherein the first channel extends through the at least one dicing lane.

In another embodiment, an integrated device assembly can include: a first integrated device die having a first circuit; a second integrated device die having a second circuit, wherein the second integrated device die is disposed over the first integrated device die; a carrier, wherein the first integrated device die is mounted to the carrier; a first channel coupled between the carrier and the first circuit, wherein the first channel extends at least partially through the first integrated device die; and a second channel coupled between the carrier and the second circuit, wherein the second channel extends through the first integrated device die and at least partially through the second integrated device die and wherein the second channel is electrically isolated from the first channel and the first circuit.

In some embodiments, the electronic device can include: a third integrated device die having a third circuit, wherein the third integrated device die is disposed over the first integrated device die and wherein the first channel is coupled between the carrier and the third circuit; and a fourth integrated device die having a fourth circuit, wherein the fourth integrated device die is disposed over the first, second, and third integrated device dies and wherein the second channel is coupled between the carrier and the fourth circuit. In some embodiments, the third integrated device die is disposed between the second and fourth integrated device dies and wherein the first channel extends through the second integrated device die. In some embodiments, the third integrated device die is disposed between first and second integrated device dies. In some embodiments, the carrier comprises a logic device.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or" in reference to a list of two or more items, covers all of the following interpretations of the word: any of the items in the list, all of the items in the list, and any combination of the items in the list.

Moreover, conditional language used herein, such as, among others, "can," "could," "might," "may," "e.g.," "for example," "such as," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only and are not intended to limit the scope of the disclosure. Indeed, the novel apparatus, methods, and systems described herein may be embodied in a variety of other forms; furthermore, various omissions, substitutions, and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An electronic device, comprising:

a first stacked assembly including a first plurality of integrated device dies, wherein the first plurality of integrated device dies comprises a first integrated device die;

a second stacked assembly including a second plurality of integrated device dies, wherein the second stacked assembly is disposed over the first stacked assembly and wherein the second plurality of integrated device dies comprises a second integrated device die;

a first channel extending at least partially through the first stacked assembly, wherein the first integrated device die comprises a first circuit and wherein the first channel is electrically connected to the first circuit; and a second channel extending through and bypassing the first stacked assembly, such that the second channel does not electrically connect to the first circuit, the second channel extending at least partially through the second stacked assembly, wherein the second integrated device die comprises a second circuit and wherein the second channel is electrically connected to the second circuit.

2. The electronic device of claim 1 wherein the first stacked assembly is directly bonded to the second stacked assembly.

3. The electronic device of claim 2 wherein the first integrated device die comprises a first non-conductive bonding layer further comprising a first plurality of conductive features and the second integrated device die comprises a second non-conductive bonding layer further comprising a second plurality of conductive features, wherein the first non-conductive bonding layer is directly bonded to the second non-conductive bonding layer and the first plurality of conductive features is directly bonded to the second plurality of conductive features.

4. The electronic device of claim 1 wherein each of the first plurality of integrated device dies comprises an active circuitry region and wherein at least read and/or write signals of the second channel bypass the active circuitry regions of the first plurality of integrated device dies.

5. The electronic device of claim 1 wherein the first stacked assembly includes a dummy die disposed adjacent to the first plurality of integrated device dies and wherein the second channel extends through the dummy die.

6. The electronic device of claim 1 further comprising an interposer, wherein the second stacked assembly is mounted on the interposer and the interposer is mounted on the first stacked assembly.

7. The electronic device of claim 6 wherein the second channel extends through the interposer and does not extend through the first plurality of integrated device dies.

8. The electronic device of claim 1, wherein the first channel comprises one or more first interconnects extending at least partially through the first integrated device die, and wherein the second channel comprises one or more second interconnects extending through the second integrated device die.

9. The electronic device of claim 8, wherein the one or more second interconnects extend through a dicing lane of the first integrated device die.

10. The electronic device of claim 1, wherein the second channel is configured to convey a first signal along a first pathway and the first channel is configured to convey a second signal along a second pathway, wherein the second pathway is longer than the first pathway, the first signal having a higher frequency than the second signal.

11. An electronic device, comprising:

a first integrated device assembly;

a second integrated device assembly disposed over the first integrated device assembly;

a first channel connected to a first circuit of the first integrated device assembly; and a second channel different from the first channel, wherein the second channel extends through the first integrated device assembly and electrically bypasses the first integrated device assembly and is connected to a second circuit of the second integrated device assembly.

12. The electronic device of claim 11 wherein the first integrated device assembly comprises a plurality of integrated device dies stacked together.

13. The electronic device of claim 12 wherein the second channel extends along a side edge of the plurality of integrated device dies.

14. The electronic device of claim 12 wherein the first integrated device assembly comprises a dummy die that is disposed adjacent to the plurality of integrated device dies and wherein the second channel extends through the dummy die and does not extend through the plurality of integrated device dies in the first integrated device assembly.

15. The electronic device of claim 12 further comprising an interposer positioned between the first and second integrated device assemblies, wherein the second channel extends through the interposer and does not extend through the plurality of integrated device dies in the first integrated device assembly.

16. The electronic device of claim 12 wherein the plurality of integrated device dies comprise a dicing lane and wherein the second channel is disposed within the dicing lane.

17. An electronic device, comprising:

a first plurality of integrated device dies;

a second plurality of integrated device dies, wherein the first and second pluralities of integrated device dies are stacked together;

a first channel extending at least partially through the first and second pluralities of integrated device dies, wherein the first channel is connected to circuitry in the second plurality of integrated device dies and electrically bypasses circuitry in the first plurality of integrated device dies; and a second channel extending at least partially through the first and second pluralities of integrated device dies, wherein the second channel is connected to circuitry in the first plurality of integrated device dies and electrically bypasses circuitry in the second plurality of integrated device dies.

18. The electronic device of claim 17 wherein at least two of the first plurality of integrated device dies are direct hybrid bonded and at least two of the second plurality of integrated device dies are direct hybrid bonded.

19. The electronic device of claim 17 wherein the first and second pluralities of integrated device dies are stacked together such that the integrated device dies of the first plurality of integrated device dies are interleaved with the integrated device dies of the second plurality of integrated device dies.

20. The electronic device of claim 17 wherein each of the first plurality of integrated device dies comprises at least one dicing lane and wherein the first channel extends through the at least one dicing lane.

* * * * *